(12) United States Patent
Martinian et al.

(10) Patent No.: US 7,327,287 B2
(45) Date of Patent: Feb. 5, 2008

(54) LOSSY DATA COMPRESSION EXPLOITING DISTORTION SIDE INFORMATION

(75) Inventors: Emin Martinian, Arlington, MA (US);
Gregory W. Wornell, Wellesley, MA (US); Ram Zamir, Tel Aviv (IL)

(73) Assignee: Massachusetts Institute of Technology, Cambridge, MA (US)

( * ) Notice: Subject to any disclaimer, the term of this patent is extended or adjusted under 35 U.S.C. 154(b) by 27 days.

(21) Appl. No.: 11/296,649

(22) Filed: Dec. 7, 2005

(65) Prior Publication Data

US 2006/0170571 A1    Aug. 3, 2006

Related U.S. Application Data

(60) Provisional application No. 60/634,583, filed on Dec. 9, 2004.

(51) Int. Cl.
*H03M 7/30* (2006.01)
(52) U.S. Cl. .................. 341/51; 341/87; 375/240.02
(58) Field of Classification Search ................ 341/51, 341/87; 382/239, 248, 251–253; 375/240.02; 704/200.1
See application file for complete search history.

(56) References Cited

U.S. PATENT DOCUMENTS

| | | | | |
|---|---|---|---|---|
| 5,172,228 | A * | 12/1992 | Israelsen | 375/240.22 |
| 5,255,090 | A * | 10/1993 | Israelsen | 375/240.12 |
| 2004/0176950 | A1 * | 9/2004 | Chu | 704/207 |

OTHER PUBLICATIONS

Shannon, C. E.; Channels with Side Information at the Transmitter; Oct. 1958; IBM Journal of Research, pp. 289-293.*
Cover et al.; Duality Between Channel Capacity and Rate Distortion with Two-Sided State Information; IEEE Transactions on Information Therory, vol. 48 No. 6, Jun. 2002, pp. 1629-1638.*
"Dynamic Information and Constraints in Source and Channel Coding", MIT, Sep. 2004, pp. 1-251 Martinian, E; doctoral thesis.
"Coset Codes—Part I: Introduction and Geometrical Classification", G. David Forney, IEEE Transactions on Information Theory, vol. 34, No. 5, Sep. 1988, pp. 1123-1151.
"Source Coding with Distortion Side Information at the Encoder", Emin Martinian, et al., Data Compression Conference, Mar. 2004 (10 pp.).
"Iterative Quantization Using Codes on Graphs", Emin Martinian, Proceedings of the 41 st Annual Allerton Conference, Monticello, IL, 2003, pp. 1-10.
"The Value and Use of Distributed Information", Title and Abstract for presentations at California Institute of Technology, Apr. 28, 2004, Notre Dame, Early Apr. 2004, and Mitsubishi Electric Research Labs, May 2004 (1 p.).
"Source Coding with Distortion Side Information at the Encoder", Slides for presentation at the 4th ETH—Technion Information Theory Workshop, Zurich, Switzerland, Feb. 17, 2004, and presentation at Bar Ilan University, Israel, Apr. 11, 2005 (37 pp.).

* cited by examiner

*Primary Examiner*—Howard L. Williams
(74) *Attorney, Agent, or Firm*—Muirhead and Saturnelli, LLC

(57) ABSTRACT

Described are techniques for performing lossy encoding. Source data and quality data are received by an encoder. The encoder maps the source data into a compressed representation having a level of distortion in accordance with the quality information. The compressed representation may be decoded without using the quality information.

40 Claims, 15 Drawing Sheets

LOSSY DATA COMPRESSION EXPLOITING DISTORTION SIDE INFORMATION

RELATED APPLICATIONS

This application claims priority to U.S. Provisional Patent Application No. 60/634,583, filed on Dec. 9, 2004, which is incorporated by reference herein.

STATEMENT OF GOVERNMENT INTEREST

This invention was made with Government support under Grant Number CCR-0073 520, awarded by NSF. The Government has certain rights in the invention.

BACKGROUND

This application generally relates to data compression, and more particularly to lossy data compression.

Data compression may be characterized as the process of encoding source information using an encoding scheme into a compressed form having fewer bits than the original or source information. Different encoding schemes may be used in connection with data compression. One class of data compression techniques is generally known as lossless data compression techniques allowing the exact original information to be reconstructed from the compressed form. Such techniques of the first class may be used when it is important that the original and decompressed forms remain identical. Another class of data compression techniques is generally known as lossy data compression techniques in which there is some acceptable loss or difference between the original and decompressed forms. Lossy compression techniques may utilize quality information indicating which portions of the source information are more or less important in comparison to other portions of the source information. The lossy compression techniques may disregard the less important information while still retaining the other more important information. For example, one viewing a picture may not notice the omission of some finer details of the background. The quality information may indicate that the foregoing background details may be less important and such information about the background details may be omitted from the compressed form. In a compression system, an encoder may be used in producing a compressed form of the source and quality information. The compressed form may subsequently be processed by a decoder to form a decompressed reconstruction of the original information.

In order for compressed data communication to work properly, the encoder and decoder have knowledge about the particular encoding scheme used. In existing lossy compression systems, the encoder receives the source information and the quality information and produces an output which compresses the source information as well as describes the quality information. Such existing systems include decoders that may receive the encoded source and quality information in order to render a lossy reconstruction of the source information. In other words, without receiving the quality information, the decoder is unable to decode the compressed form of the source information.

It may be desirable to utilize techniques in which the decoder can decode received compressed input independent of whether the quality information is made available to the decoder.

SUMMARY OF THE INVENTION

In accordance with one aspect of the invention is a method for performing lossy encoding comprising: receiving source data and quality information; and mapping the source data into a compressed representation having a level of distortion in accordance with the quality information, wherein said compressed representation may be decoded without using said quality information. The compressed representation may be formed using a fixed codebook with a variable partition. The quality information may include a distortion weighting value for each source sample included in said source data, said weighting value weighting an error between said each source sample and a lossy reconstruction of said source sample. The compressed representation may be formed using a lattice. The compressed representation may be formed using nested lattices. The compressed representation may be formed using a transform. The compressed representation may be formed using a curve fitting technique. The compressed representation may be formed using an error correcting code. The compressed representation may be formed using a hierarchy of one or more lattices and a linear code. A first source sample may be included in said source data and indicated by said quality information as more important than a second source sample included in said source data, and said first source sample may be assigned a first lattice in said hierarchy and said second source sample may be assigned a second different lattice in said hierarchy. The method may also include determining a quantization point in a lattice assigned to a source sample included in said source data; and decomposing said quantization point for said source sample in said source data in accordance with quality information for said source sample. The decomposing may further comprise performing a number of iterations of a decomposition step in accordance with a specified level of quality information for said source sample. The method may also include quantizing all source samples of said source data of a certain quality level as indicated by the quality data in accordance with an assigned lattice of quantization points; decomposing each source sample of said certain quality level into one or more decomposition components; and performing a first technique to correctly match a first decomposition component of each source sample of said certain quality level. The first technique may interpolate a decomposition component for another source sample at a quality level other than said certain quality level. The quality information may indicate an importance of each source sample included in said source data relative to other source samples included in said source data.

In accordance with another aspect of the invention is a method for performing lossy encoding comprising: receiving a set of points and a set of quality information; and mapping said set of points to quantized points, wherein a first rule is used for mapping a first of said points to a first quantized point in accordance with a fixed codebook and a first indicator in said quality information, a second rule is used for mapping a second of said points to a second quantized point in accordance with said codebook and a second indicator in said quality information. The quality information may indicate an importance of each point in said set of points relative to other points included in said set of points. A rule may be associated with each level of quality indicated in said quality information, said rule being used to determine a partition associated with each quantization point in said fixed codebook, said partition varying in accordance with said each level of quality. A first rule may define a quality level indicating that said first point is more important than said second point, said first rule defining partitions having a finer granularity than partitions defined by said second rule.

In accordance with another aspect of the invention is a method for performing lossy encoding comprising: receiving a fixed codebook of quantization points and a plurality of rules, each rule defining a different partition used in mapping a source point to a quantization point; receiving source data including a plurality of source points; receiving quality information indicating a plurality of quality levels, each of said quality levels being associated with a different one of said rules, each of said source points being associated with one of said plurality of quality levels; and determining a quantization point for each of said source points in accordance with a quality level and associated rule for each source point.

In accordance with another aspect of the invention is a computer program product for performing lossy encoding comprising code for: receiving source data and quality information; and mapping the source data into a compressed representation having a level of distortion in accordance with the quality information, wherein said compressed representation may be decoded without using said quality information. The compressed representation may be formed using a fixed codebook with a variable partition. The quality information may include a distortion weighting value for each source sample included in said source data, said weighting value weighting an error between said each source sample and a lossy reconstruction of said source sample. The compressed representation may be formed using a lattice. The compressed representation may be formed using nested lattices. The compressed representation may be formed using a transform. The compressed representation may be formed using a curve fitting technique. The compressed representation may be formed using an error correcting code. The compressed representation may be formed using a hierarchy of one or more lattices and a linear code. A first source sample included in said source data may be indicated by said quality information as more important than a second source sample included in said source data, and said first source sample may be assigned a first lattice in said hierarchy and said second source sample may be assigned a second different lattice in said hierarchy. The computer program product may also include code for: determining a quantization point in a lattice assigned to a source sample included in said source data; and decomposing said quantization point for said source sample in said source data in accordance with quality information for said source sample. The code for decomposing may further comprise code for: performing a number of iterations of a decomposition step in accordance with a specified level of quality information for said source sample. The computer program product may also include code for: quantizing all source samples of said source data of a certain quality level as indicated by the quality data in accordance with an assigned lattice of quantization points; decomposing each source sample of said certain quality level into one or more decomposition components; and performing a first technique to correctly match a first decomposition component of each source sample of said certain quality level. The first technique may interpolate a decomposition component for another source sample at a quality level other than said certain quality level. The quality information may indicate an importance of each source sample included in said source data relative to other source samples included in said source data.

In accordance with another aspect of the invention is a computer program product for performing lossy encoding comprising code for: receiving a set of points and a set of quality information; and mapping said set of points to quantized points, wherein a first rule is used for mapping a first of said points to a first quantized point in accordance with a fixed codebook and a first indicator in said quality information, a second rule is used for mapping a second of said points to a second quantized point in accordance with said codebook and a second indicator in said quality information. The quality information may indicate an importance of each point in said set of points relative to other points included in said set of points. A rule may be associated with each level of quality indicated in said quality information, said rule being used to determine a partition associated with each quantization point in said fixed codebook, said partition varying in accordance with said each level of quality. A first rule may define a quality level indicating that said first point is more important than said second point, said first rule defining partitions having a finer granularity than partitions defined by said second rule.

In accordance with another aspect of the invention is a computer program product for performing lossy encoding comprising code for: receiving a fixed codebook of quantization points and a plurality of rules, each rule defining a different partition used in mapping a source point to a quantization point; receiving source data including a plurality of source points, receiving quality information indicating a plurality of quality levels, each of said quality levels being associated with a different one of said rules, each of said source points being associated with one of said plurality of quality levels; and determining a quantization point for each of said source points in accordance with a quality level and associated rule for each source point.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
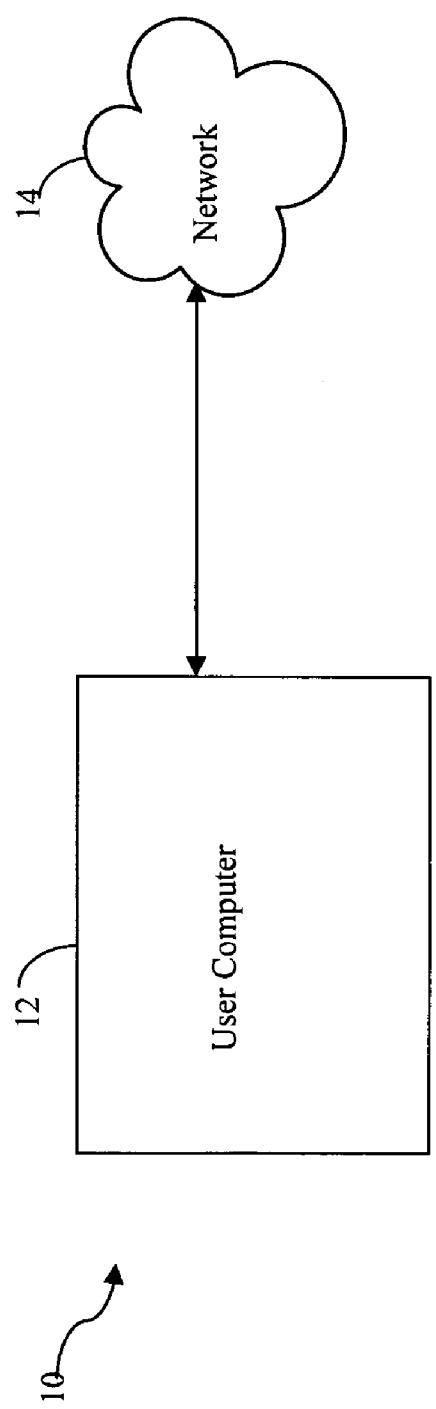
FIG. 1 is an example of an embodiment illustrating an environment that may be utilized in connection with the techniques described herein.

Referring now to FIG. 1, illustrated is an example of a suitable computing environment in which embodiments utilizing the techniques described herein may be implemented. The computing environment illustrated in FIG. 1 is only one example of a suitable computing environment and is not intended to suggest any limitation as to the scope of use or functionality of the techniques described herein. Those skilled in the art will appreciate that the techniques described herein may be suitable for use with other general purpose and specialized purpose computing environments and configurations. Examples of well known computing systems, environments, and/or configurations include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like.

The techniques set forth herein may be described in the general context of computer-executable instructions, such as program modules, executed by one or more computers or other devices. Generally, program modules include routines, programs, objects, components, data structures, and the like, that perform particular tasks or implement particular abstract data types. Typically the functionality of the program modules may be combined or distributed as desired in various embodiments.

Included in FIG. 1 is a user computer 12 and a network 14. The user computer 12 may include a standard, commercially-available computer or a special-purpose computer that may be used to execute one or more program modules. Described in more detail elsewhere herein are program modules that may be executed by the user computer 12 in connection with facilitating the lossy data compression and/or decompression techniques described herein. The user computer 12 may operate in a networked environment and communicate with other computers not shown in FIG. 1.

It will be appreciated by those skilled in the art that although the user computer is shown in the example as communicating in a networked environment, the user computer 12 may communicate with other components utilizing different communication mediums. For example, the user computer 12 may communicate with one or more components utilizing a network connection, and/or other type of link known in the art including, but not limited to, the Internet, an intranet, or other wireless and/or hardwired connection(s).

Figure 2:
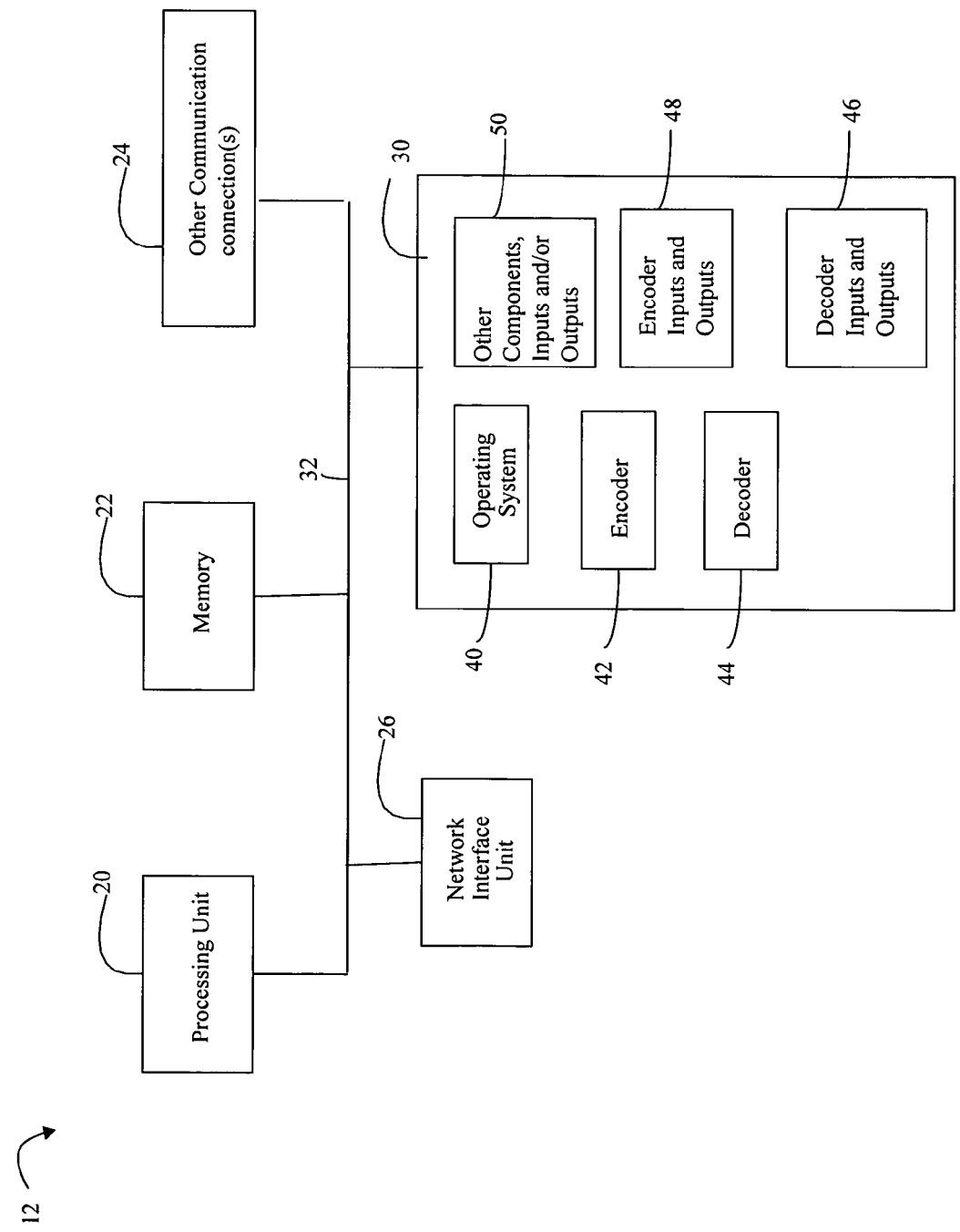
FIG. 2 is an example of components that may be included in an embodiment of a user computer for use in connection with performing the techniques described herein.

Referring now to FIG. 2, shown is an example of components that may be included in a user computer 12 as may be used in connection with performing the various embodiments of the techniques described herein. The user computer 12 may include one or more processing units 20, memory 22, a network interface unit 26, storage 30, one or more other communication connections 24, and a system bus 32 used to facilitate communications between the components of the computer 12.

Depending on the configuration and type of user computer 12, memory 22 may be volatile (such as RAM), non-volatile (such as ROM, flash memory, etc.) or some combination of the two. Additionally, the user computer 12 may also have additional features/functionality. For example, the user computer 12 may also include additional storage (removable and/or non-removable) including, but not limited to, USB devices, magnetic or optical disks, or tape. Such additional storage is illustrated in FIG. 2 by storage 30. The storage 30 of FIG. 2 may include one or more removable and non-removable storage devices having associated computer-readable media that may be utilized by the user computer 12. The storage 30 in one embodiment may be a mass-storage device with associated computer-readable media providing non-volatile storage for the user computer 12. Although the description of computer-readable media as illustrated in this example may refer to a mass storage device, such as a hard disk or CD-ROM drive, it will be appreciated by those skilled in the art that the computer-readable media can be any available media that can be accessed by the user computer 12.

By way of example, and not limitation, computer readable media may comprise computer storage media and communication media. Memory 22, as well as storage 30, are examples of computer storage media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by user computer 12. Communication media typically embodies computer readable instructions, data structures, program modules or other data in a modulated data signal such as a carrier wave or other transport mechanism and includes any information delivery media. Combinations of the any of the above should also be included within the scope of computer readable media.

The user computer 12 may also contain communications connection(s) 24 that allow the user computer to communicate with other devices and components such as, by way of example, input devices and output devices. Input devices may include, for example, a keyboard, mouse, pen, voice input device, touch input device, etc. Output device(s) may include, for example, a display, speakers, printer, and the like. These and other devices are well known in the art and need not be discussed at length here. The one or more communications connection(s) 24 are an example of communication media.

In one embodiment, the user computer 12 may operate in a networked environment as illustrated in FIG. 1 using logical connections to remote computers through a network. The user computer 12 may connect to the network 14 of FIG. 1 through a network interface unit 26 connected to bus 32.

The network interface unit 26 may also be utilized in connection with other types of networks and/or remote systems and components.

One or more program modules and/or data files may be included in storage 30. During operation of the user computer 12, one or more of these elements included in the storage 30 may also reside in a portion of memory 22, such as, for example, RAM for controlling the operation of the user computer 12. The example of FIG. 2 illustrates various components including an operating system 40, an encoder 42, a decoder 44, decoder inputs and outputs 46, encoder inputs and outputs 48, and other components, inputs, and/or outputs 50. The operating system 40 may be any one of a variety of commercially available or proprietary operating systems. The operating system 40, for example, may be loaded into memory in connection with controlling operation of the user computer. The encoder 42 and decoder 44 may be used in connection with a lossy compression system utilizing the techniques described herein. The encoder inputs and outputs 48 collectively represents the various inputs and outputs of the encoder 42. The decoder inputs and outputs 46 collectively represents the various inputs and outputs of the decoder 44. The encoder 42 may be used in connection with compressing received input data generating compressed output data. The decoder 44 may be used in connection with decompressing compressed data, as produced by the encoder 42, to generate a lossy construction of the original or source input data. The foregoing components included in FIG. 2 are described in more detail in following paragraphs.

Although the components, such as the decoder and encoder, are shown as being included in a single computer system, the components may be included on different computer systems and operate in accordance with the techniques described herein. For example, a decoder may be included on a user computer. An encoder and associated encoder inputs and outputs may be located on another computer system connected to the user computer 12 through the network 14 as illustrated in FIG. 1. During operation, the encoder on the other computer system may compress source data and generate a compressed output. The user computer may download the compressed data which is then used as input to the decoder executing on the user computer. The foregoing, and other variations of the exemplary embodiments described herein, will be appreciated by those of ordinary skill in the art.

Before proceeding to describe in more detail the encoder 42 and decoder 44 operating in accordance with the techniques described herein, what will be described is the operation of an encoder and decoder in accordance with existing loss compression systems that do not utilize the techniques described herein.

Figure 3:
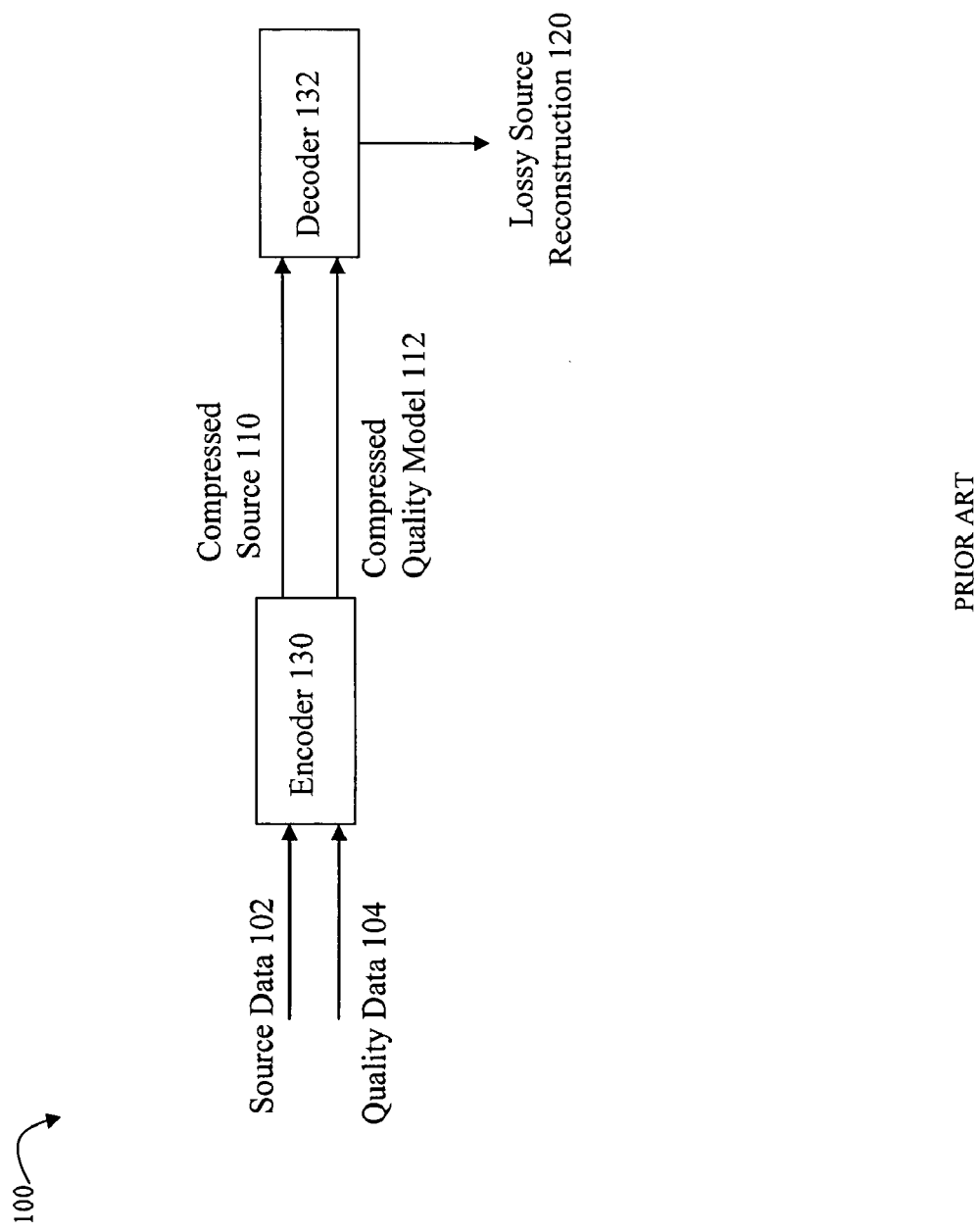
FIG. 3 is an example of components that may be included a prior art lossy compression system.

Referring now to FIG. 3, shown is an example of an embodiment of an encoder and decoder as may be included in a prior art lossy compression system. The example 100 includes an encoder 130 and decoder 132. Note that the encoder and decoder of FIG. 3 have different element numbers than as depicted in FIG. 2 to differentiate between the encoder and decoder of existing prior art systems and those used in connection with the techniques described herein. The encoder 130 takes as inputs the source data 102 and quality data 104 and produces a compressed source 110 and a compressed form of the quality model 112 as represented in accordance with the quality data 104. As known in the art, one class of data compression techniques is generally known as lossy data compression techniques in which there is some acceptable loss, distortion, or difference between the original source data and its decompressed or reconstructed form. Lossy compression techniques may utilize quality information, as represented by elements 104 and 112, indicating which portions of the source information are more or less important in comparison to other portions of the source information. The lossy compression techniques utilized by the encoder 130 may disregard the less important information while still retaining the other more important information.

In order for compressed data communication to work properly, the encoder 130 and decoder 132 have knowledge about the particular encoding scheme used. In existing lossy compression systems, the encoder 132 receives the source data 102 (e.g., pixels in an image) and the quality data 104 (e.g., specifying which pixels are more important than others). The encoder 130 may compress the source data 102 into a bit-based representation, and also allocates bits in the encoded output describing the quality model to the decoder, as illustrated by 112. For example, in the JPEG2000 image compression standard, the encoder can explicitly allocate more bits (and hence higher quality) to certain blocks. For the decoder to know how to properly interpret the resulting bit stream, the encoder sends a description of how many bits are allocated to each block (this corresponds to the compressed quality model 112). A decoder 132 in existing systems may receive both the compressed source 110 and the compressed quality model 112 to produce a lossy reconstruction of the original source 120. In both the JPEG2000 standard and other existing lossy compression systems, the decoder will be unable to decode the bitstream unless it also receives the compressed quality model as illustrated in FIG. 3.

The foregoing quality model in existing systems may be stored with the compressed source and increases the storage requirements thereof. The techniques described herein do not require that data corresponding to the quality model be available to the decoder in order to generate the lossy source reconstruction. Additionally, the techniques described herein for lossy decompression allow the encoder to produce a smaller bit stream output as the compressed source for more efficient compression. In other words, the overall size of the compressed output generated by the encoder may be reduced by not having to also include the encoded or compressed quality model information.

Figure 4:
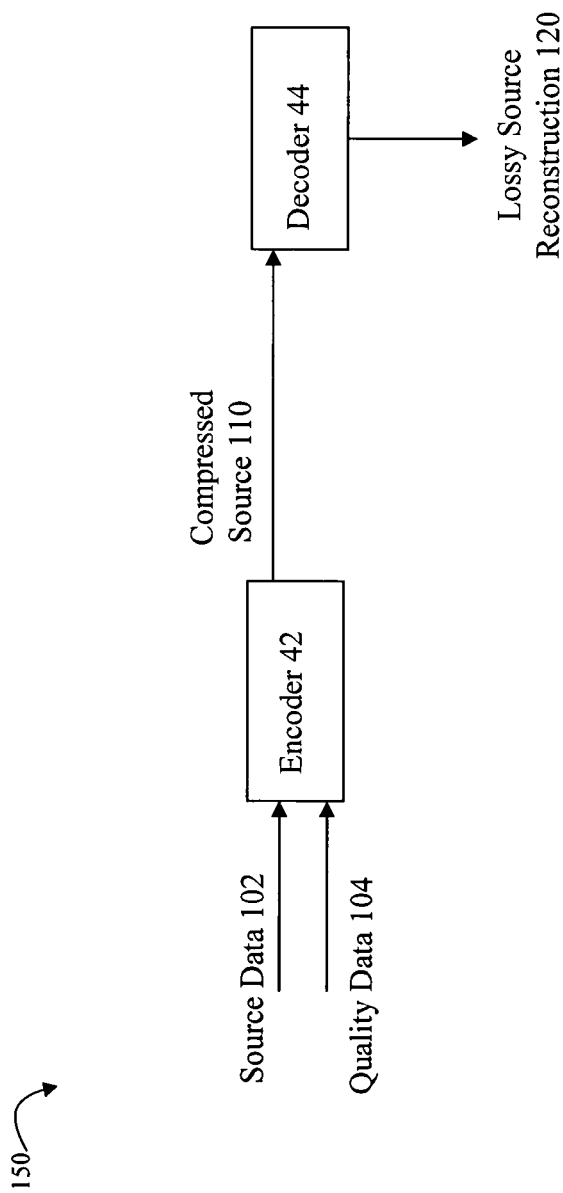
FIG. 4 is an example illustrating in more detail components from FIG. 2 that may be included in an embodiment utilizing the techniques described herein.

Referring now to FIG. 4, shown is an example illustrating in more detail the components included in FIG. 2 in accordance with the lossy compression techniques as described herein in more detail in following paragraphs. The encoder 42 receives as inputs the source data 102 and quality data 104 and generates as an output the compressed source 110. In contrast to FIG. 3, the encoder 42 operating in accordance with the techniques described herein does not output the compressed data model 112. The decoder 44, operating in accordance with the techniques described herein, takes as input the compressed source 110 to generate the lossy source reconstruction 120.

The encoder 42 utilizes a fixed codebook with a variable partition in connection with performing lossy compression. An embodiment using such techniques may be implemented in many different ways using, for example, curve fitting, lattices, and error correcting codes. Described in more detail elsewhere herein are a variety of different methods that may be utilized in connection with the lossy compression techniques with a fixed codebook and variable partition.

It should be noted that the techniques described herein may be used in connection with any one or more different types of source data including, for example, image data, audio data, video data, and the like. The quality data input to the encoder may vary in accordance with the type of source data. For example, if the source data is an image, the quality data may specify that background data is not as important as some image details. If the source data is audio data, the quality information represents quality with respect to aspects of the audio data. If the source data is video data, the quality data may indicate whether brightness or color of the source is more important.

The quality data or information as received by the encoder may be defined as information indicating the relative importance of one or more source data samples with respect to other source data samples. In other words, the quality information may be used in ranking the source data samples relative to each other. As illustrated, a decoder in a system using the techniques described herein does not have knowledge of the foregoing quality information as communicated to the encoder.

What will first be described is a codebook in more detail. A codebook may be characterized as a template or collection of reconstruction points each corresponding to an encoded bit string. The encoder may map a source data point to one of the codewords included in the codebook. The decoder may then use the codebook in determining how a given encoded bit string can be decoded or decompressed into a reconstruction of a source. In one representation, a codebook may be a two column table where the first column represents an encoded bit string and the second column represents a corresponding reconstruction point. For purposes of illustration, following is an example representation of a codebook as may be used to quantize pairs of pixels below. The encoded bit strings may also be referred to as codewords or quantization points of the codebook.

Example Codebook

| Bit String | Reconstructed Pixel Pair |
|---|---|
| 000000 | 0, 0 |
| 000001 | 0, 4 |
| 000010 | 0, 4 |
| 000011 | 1, 1 |
| 000100 | 1, 5 |
| . . . | . . . |

For example, the examplary codebook above indicates that if the bit string 000100 is received by the decoder, then the decoder should reconstruct the pixel pair (1, 5).

The encoder in an embodiment using a fixed codebook and variable partition may be presented with source data, which the encoder compresses and/or quantizes. As described above, an additional input to the encoder is the quality data or distortion side information describing the relative importance of each source sample. The encoder uses the quality data to select a mapping to map the source data to an element of the codebook. This selection of a mapping by the encoder corresponds to the "variable partition" in the sense that a partition is a way of assigning source data to codebook elements. The techniques described herein use codebooks such that for each set of quality data, there exists a potentially different mapping or partition which the encoder can use to map the source data to an element of the codebook so as to minimize the quantization distortion described by the quality data.

The term "fixed codebook" as used herein may be used to describe an aspect of an architecture in which, although the mapping from source data to codebook element depends on the quality data, the codebook itself is fixed and does not depend on the quality data. This allows the decoder to reconstruct the encoded bit string without requiring knowledge of the quality data.

As another example, consider a single data point x,y representing two pixel values or two samples as a single 2-dimensional data point. Existing prior art lossy compression techniques may take this single data point for two samples and quantize it to be an integer in both the x and y directions using two different codebooks. As described above, a sample data point may be quantized to the nearest quantization point. Quantization provides for mapping one or more sample data points to the closest one of the quantization data points included in a codebook.

Figure 5:
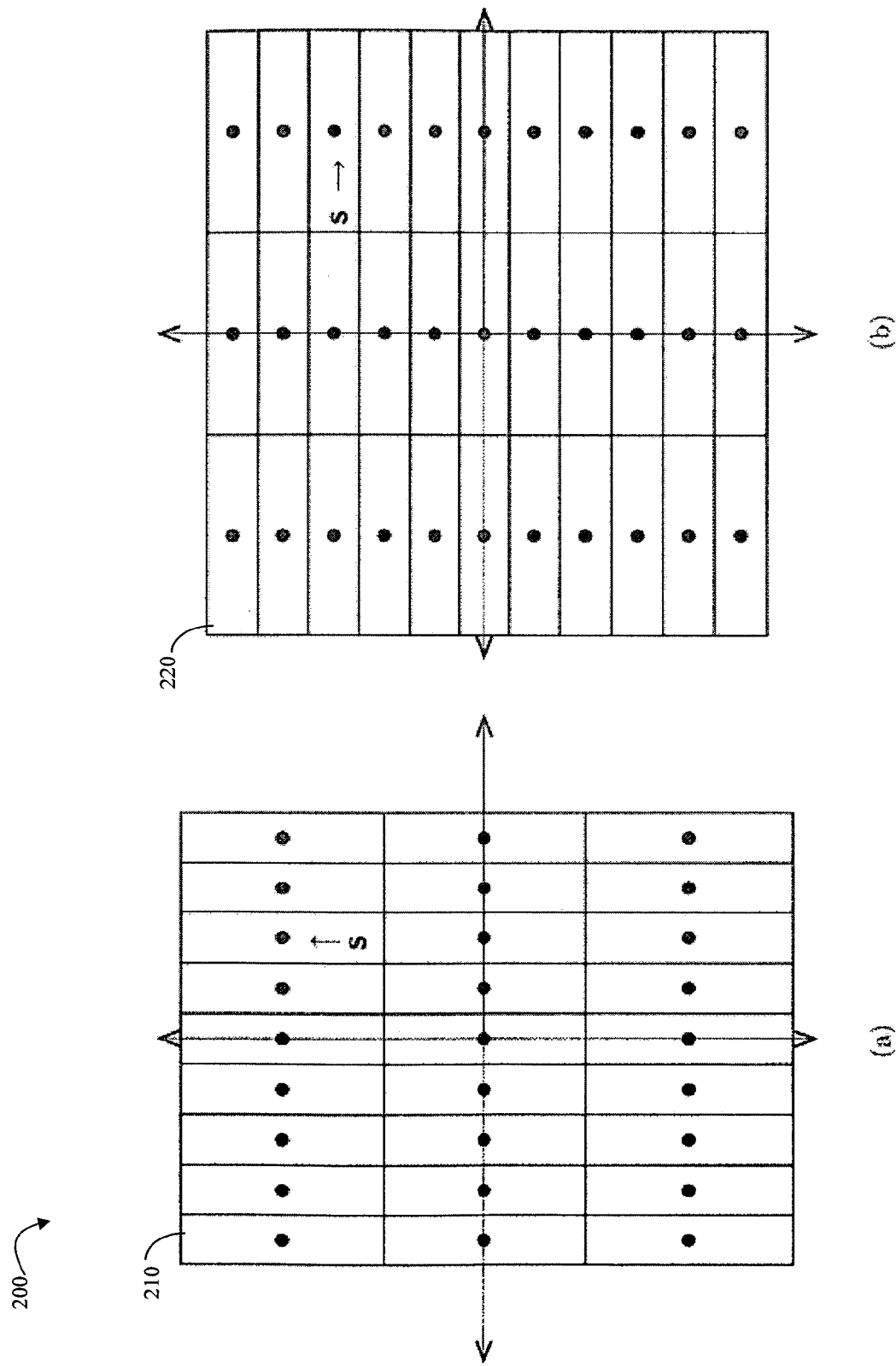
FIG. 5 is an example illustrating use of multiple codebooks as may be used in connection with lossy data compression techniques.

Referring now to FIG. 5, shown are examples of two different codebooks as may be used in connection with an existing prior art system as illustrated in FIG. 3. The first codebook 210 includes a granularity for quantization which is finer in the horizontal direction than the vertical direction's granularity. The second codebook 220 includes a granularity which is coarser in the horizontal direction than that of the vertical direction. If the quality information for an x,y data point indicates that source data in the horizontal is more important than that of the vertical direction, then the encoder may use the codebook 210 rather than 220. In contrast, if the quality information indicates that source data in the vertical direction is more important than that of the horizontal direction, then the encoder may use the codebook 220 rather than 210. The encoder selects a quantization point in accordance with the particular codebook.

The information passed as an input to the decoder in prior art systems is the quantization point as well as quality data indicating which of the multiple codebooks have been utilized. The foregoing in connection with FIG. 5 illustrates an example of prior art variable codebooks. In order for the decoder to properly decode the compressed or quantized data, the decoder needs the quality information indicating the particular codebook. The foregoing describes only two dimensions for the purposes of illustration. Actual applications may include a larger and varying number of dimensions. Note that the points included in the example 200 are the quantization points. "s" may correspond to a particular source data point which is then mapped to a particular one of the quantization points.

In contrast to the use of multiple codebooks of FIG. 5 as may be used prior art systems, the techniques described herein utilize a fixed codebook and variable partition in connection with the quantization. In connection with this architecture, there is no need to include in the encoded information the encoded quality information.

Figure 6:
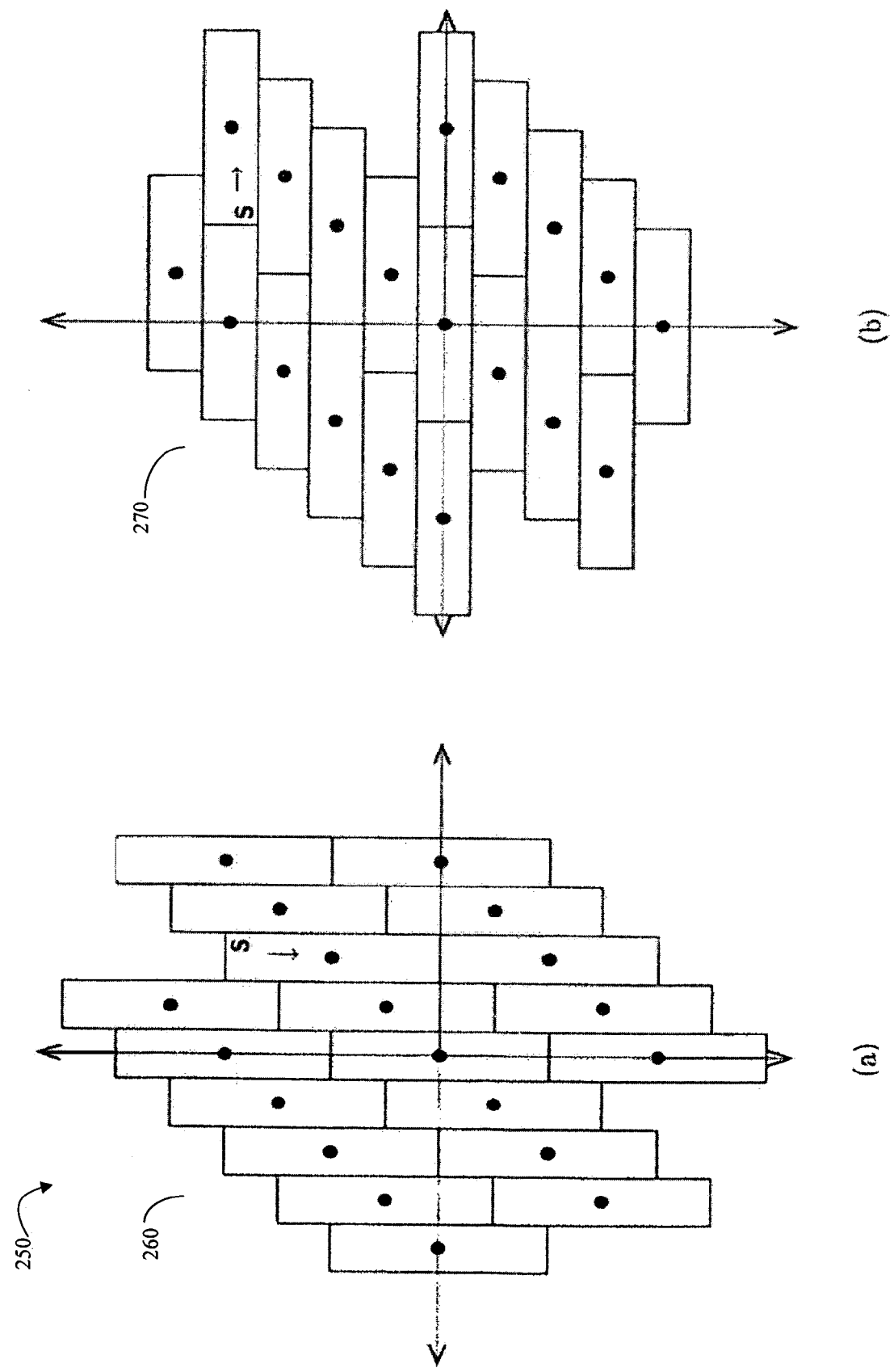
FIG. 6 is an example illustrating use of a single codebook and variable partitioning as may be used in connection with the techniques described herein.

Referring now to FIG. 6, shown is an example using a fixed codebook with variable partitions. In connection with 260 and 270, note the same quantization points are defined for both representing the same fixed codebook of codewords or quantization points. However, the partitions as may be defined in accordance with mapping rules are different for each of 260 in 270. In this example, the partitions are illustrated as rectangular but may be of any varying shape or size. In connection with 260, a first mapping rule may be defined and used if horizontal data is more important so that there is a smaller error in the horizontal direction in comparison to the vertical error. If vertical information is more important, a second different mapping rule may be defined as illustrated in 270 so that there is a smaller error in the vertical direction in comparison to the horizontal error. Any source data point falling within one of the rectangular regions associated with a quantization point (e.g., as represented by the dots) is then mapped to that particular quantization point. The quantization points are fixed and the partition or rule for mapping the source to one of the quantization points may be varied in accordance with the quality data. The rule describes how to map source data to one of the codewords (e.g., quantization points) included in the fixed codebook.

Figure 7:
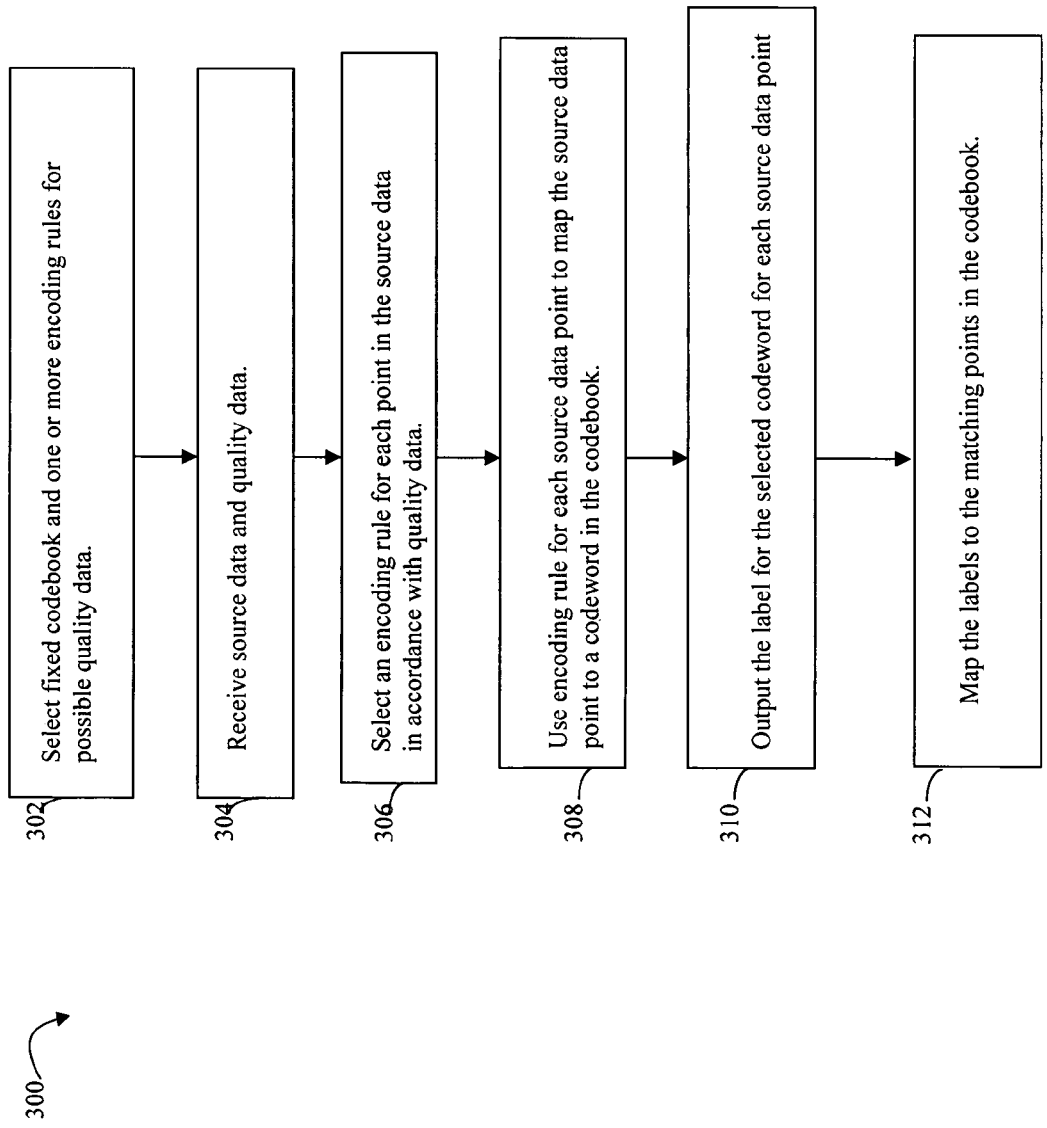
FIG. 7 is a flowchart of processing steps that may be performed in connection with the lossy data compression and decompression techniques described herein.

Referring now to FIG. 7, shown is a flowchart of processing steps that may be performed in an embodiment utilizing the techniques described herein for lossy data compression. It should be noted that the processing steps of FIG. 7 may be performed using a source vector including multiple source samples in which the entire source vector may be used in connection with deciding how to encode each sample included therein. It will be appreciated by those of ordinary skill in the art that variations of the particular embodiments illustrated herein may also be utilized with the techniques described herein. The steps of flowchart 300 generally summarize processing just described as may be performed by an encoder and a decoder. Additional detail is provided in connection with various steps. At step 302, a fixed codebook and one or more encoding rules for possible quality data may be selected. The fixed codebook may be as described. An embodiment may define one or more encoding rules for each of the possible types of quality data that may be input. For example, an embodiment may have only two types of quality data. A first type may indicate that minimization of horizontal error is important, and a second type may indicate that minimization of vertical error is important. Two different rules, one for each type, may be defined as illustrated in connection with FIG. 6 if the same rule is used for each associated codeword or quantization point in the fixed codebook. It should be noted that the mapping rules may vary with the type of source data and the type of quality data that may be expected as input to the encoder. An embodiment may also define different mapping rules for each of the different quantization points or codewords. In other words, for first quality information, there may be a first rule for one quantization point and a second different rule for another quantization point. At step 304, a set of source data and quality data may be received by the encoder.

At step 306, an encoding rule is selected for each point in the source data in accordance with the quality data also received at step 304. A mapping rule for a given source data point, s, may be represented as a function. The particular mapping rule or function selected may vary in accordance with quality information, q, to select a particular codeword. The foregoing function may be used to map the source data point, s, to the nearest quantization point or codeword in accordance with the quality information. This may be represented as:

$$f_q(s) = \text{selected codeword}$$

It should be noted that the mapping rules or functions may or may not be deterministic for a same source data point. If a mapping rule is not deterministic, different reconstructions may be made by the decoder at different points in time for the same source data. Following is an example of when non-deterministic mapping rules may be used in an embodiment. An embodiment may utilize non-deterministic rules, for example, when performing curve fitting techniques as described elsewhere herein in more detail. When the source data includes a relatively small number of points, the curve fitting techniques may be used in connection with all the source data points. However, if the number of source data points is too large beyond some threshold level in accordance with an embodiment, curve fitting for all the data points may be too computationally expensive. As an alternative, an embodiment may randomly select some subset of the source data points for which curve fitting is performed.

At step 308, the encoding rules selected for the source data points are used to map each source data point to a codeword in the codebook. At step 310, the encoder may output the label for each of the selected codewords of each of the source data points. The output from step 310 may be used as an input to the decoder in step 312 in which the decoder maps the labels to the matching points in the code book in connection with providing a lossy reconstruction of the original data received at step 304.

It should be noted that step 302 may be characterized as a step performed prior to encoding any source data for compression. Step 302 may be performed using automated and/or manual techniques. Steps 304, 306, 308 and 310 may be performed by an embodiment of the encoder. Step 312 may be performed by the decoder.

It should also be noted that an encoding rule may be selected for every group of dimensions as may be represented by a single data point. In the example illustrated in connection with FIG. 6, a single data point was used to represent two dimensions. It may be that a single point corresponds to a different number of dimensions, and accordingly, a single encoding rule may be selected for mapping that single point to one of the codewords or quantization points. As described herein, the fixed codebook does not depend on the quality model or quality data.

Although the fixed codebooks illustrated herein may include a uniform arrangement of codewords or points, an embodiment may utilize a fixed codebook that includes codewords in a more scattered or non-uniform arrangement. An embodiment may utilize an existing codebook, for example, in accordance with an existing standard with the techniques herein. An embodiment may also specifically develop a new codebook for use with the techniques herein. As an example, a variety of well-known techniques for codebook generation may be executed to produce multiple codebooks. Testing may be performed on the particular source data and associated possible quality data using each of the different codebooks to determine which codebook is best. Note that in evaluating a particular codebook for use with the techniques described herein in an embodiment, a comparison may be made to results achieved in connection with existing prior art systems as related to quality of the compressed source data and its reconstructed form.

Figure 8:
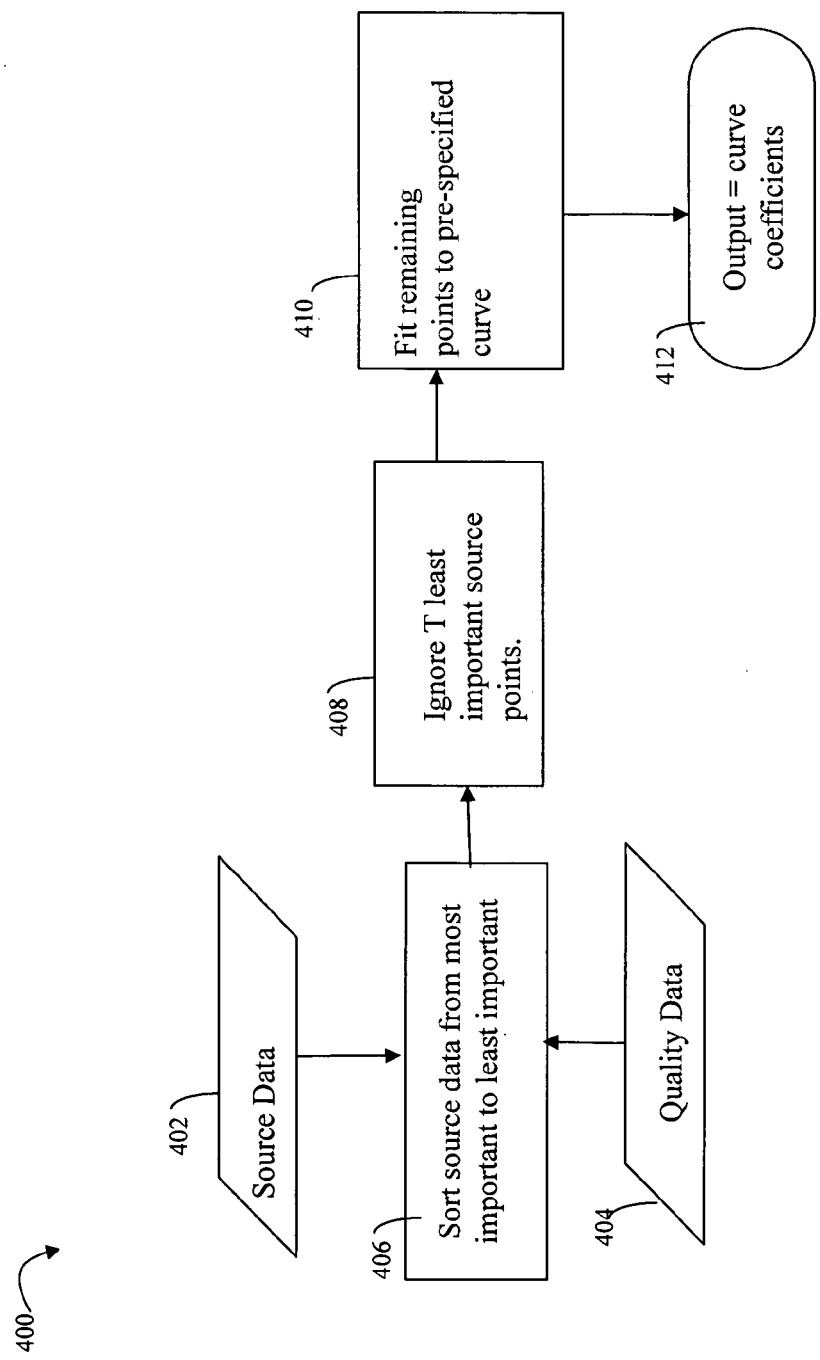
FIG. 8 is a flowchart of processing steps that may be performed in connection with a curve fitting embodiment of an encoder using the techniques described herein.

Referring now to FIG. 8, shown is a flowchart of processing steps that may be performed by an embodiment of an encoder utilizing curve fitting techniques. Source data 402 and quality data 404 are input to the encoder. At step 406, the encoder sorts the source data in an ordered list in accordance with importance of the source data (e.g., from the most important data point to the least important data point). The relative importance of certain data points with respect to other remaining data points may be determined in accordance with quality data also input to the encoder. At step 408, the encoder may ignore or erase the T least important source points, where T is some integer threshold selected by the encoder designer. The particular number of source points ignored may vary in accordance with each embodiment. It should be noted that there may be certain considerations made in connection with selection of a value for T. One consideration involves the level of compression desirable. If a relatively large amount of compression is desired, T may be selected to be accordingly large so that more source data points are erased or ignored. In contrast, if a minimal amount of compression is desired, T may be selected to be accordingly small so that a lesser number of source data points are erased or ignored. A designer of the encoder may perform empirical testing for various values of T and select a value in accordance with the particular embodiment and application.

At step 410, a standard curve fitting technique may be used to fit the remaining or unerased source points to a prespecified curve known to both the encoder and decoder. Any one of a variety of different curve fitting techniques such as, for example, cubic spline curve fitting, and the like, maybe using connection with step 410 processing. At step 412, the curve coefficients determined as result of step 410 processing may then be output as the compressed version of the source data. The curve coefficients output at step 412 may be used by the decoder and performing decompression. The decompression may be performed by mapping the curve coefficients back into the original curve.

In connection with the curve fitting technique described and illustrated in FIG. 8, the prespecified curve, such as a polynomial, and possible coefficients thereof may be characterized as the fixed code book known to both the encoder and decoder. The curve fitting process may be characterized as quantizing the source data points to determine the coefficients. The particular order of the curve utilized, such as the order of a polynomial, may have an order determined in accordance with the number of important or significant source points. The particular points which are important may be as determined by the encoder in accordance with the quality data.

As an example, consider a curve parameterized by some set of coefficients $a\_0, a\_1, \ldots, a\_\{k-1\}$. A codebook may be defined where the encoded bit string corresponds to a description of the a_i coefficients, and the reconstructed result corresponds to the vector obtained by evaluating the curve at n points. For example, the curve may be a parabola of the form:

$$c(t)=a\_2*t^2+a\_1*t+a\_0$$

and each a_i coefficient may take on any integer value between 0 and 255. A codebook may be defined by having the decoder map a bit string describing the a_i's to the vector [c(t=0), c(t=1), c(t=2), c(t=3)]. A partial list of the resulting "Parabola Codebook" is illustrated below.

| Parabola Codebook | |
|---|---|
| a_0 a_1 a_2 | Reconstructed Vector |
| 0, 0, 0 | 0, 0, 0, 0 |
| 1, 0, 0 | 1, 1, 1, 1 |
| 1, 2, 0 | 1, 3, 5, 7 |
| 2, 0, 1 | 1, 3, 6, 10 |
| . . . | . . . |

What has been illustrated above is how a curve defines a fixed codebook. What will now be described in more detail is how an embodiment may achieve a corresponding variable partition. One way to achieve a variable partition is to choose the mapping which maps a source vector of one or more source data points to a set of integer coefficients a_i so as to minimize the error between the source and the reconstruction. For example, an embodiment may use a given set of quality data in the form of a quality vector which weights the squared error between the source data points and the reconstructed form of the source data, as may be generated by the decoder. It will be appreciated by those of ordinary skill in the art that a matrix may be constructed that can be applied to the source vector to produce the optimal vector of a_i's. The matrix accomplishing this mapping will be different for each quality vector even though the codebook remains fixed. Thus the matrix accomplishing the weighted least square curve fit is an example of the variable partition.

To summarize, an embodiment using curve fitting can yield a fixed codebook variable partition architecture by using, for example, the following steps:

1. Choose a curve c(t) parameterized by a set of coefficients $a\_0, a\_1, \ldots, a\_\{k-1\}$. In the parabola example, the curve was $c(t)=a\_2*t^2+a\_1*t+a\_0$ and the a_i were quantized to integers between 0 and 255.
2. Choose a set of n points $t\_0, t\_1, \ldots, t\_\{n-1\}$ on which to evaluate the curve. In the parabola example, the set of points was t_0=0, t_1=1, t_2=2, t_3=3.
3. The fixed codebook is then all possible values of the a_i coefficients and the corresponding curve vector $[c(t=t\_0), \ldots, c(t=t\_\{n-1\})]$.
4. The previous steps are all done before any encoding or decoding occurs. To encode, an encoder is given a source vector and a quality vector. First the encoder determines a mapping which maps the source vector into a set of coefficients a_i which minimizes the distortion between the source and the reconstruction. This mapping will depend on the quality vector.
5. The a_i coefficients are stored or transmitted.
6. The decoder reconstructs the source using the fixed codebook. The decoder may evaluate the curve at the specified positions with the stored or transmitted a_i coefficients. For example, the decoder performs decoding of the compressed output by evaluating the curve at specified positions (e.g., determines values for y=f(x) for a specified number of values for x).

As described above, an embodiment of an encoder utilizing curve fitting techniques may communicate to the decoder values for the coefficients. The coefficients may be stored as the decompressed form of the source data. An embodiment of the encoder and decoder of a lossy compression system may be constructed to utilize a same curve. In other words, both the encoder and decoder may be programmed to perform processing utilizing a same curve. Similarly, an embodiment of the encoder and decoder may be programmed to perform processing in accordance with a selected number of known data points, n. In connection with decoding, the decoder evaluates the curve for a set of values where n represents the quantity of values in the set. It should be noted that an embodiment may have an encoder encode a value for n in the compressed output as an alternative to having a value for n be known or understood by both the encoder in the decoder.

Among many other techniques known to those skilled in the art, two ways of performing curve fitting are using matrix inversion, for example, for real-valued data in a finite field, or Reed Solomon coding, for example, for integer valued data. In connection with matrix inversion, the points on the curve may be represented as the multiplication of a matrix M (which will depend on the particular curve) with the curve coefficients c. In this case, the curve coefficients c can be obtained by inverting the matrix equation M*c=d to obtain $d=M^{-1} c$ where d is a vector representing the non-erased source points.

For a fixed length curve fitting system, the encoder and decoder agree on a fixed curve, number of source data points (N), and number of significant data points to which the curve is fit (K). Furthermore, the encoder and decoder agree on the set S of N points on which to evaluate the polynomial. S may correspond to the integers 0, 1, . . . , N−1, but for certain curves other evaluation sets may be more appropriate. The parameter K affects the degree of the curve such as the degree of the polynomial. The number of points at which the curve is evaluated is equal to the number of source data points (N). As an output, the encoder produces the K coefficients which are input to the decoder. The decoder reconstructs a lossy version of the source data by evaluating the curve in accordance with the K coefficients for the N points of the evaluation set S.

A variable length system can be obtained by having the encoder further describe the relevant lengths (N and K) to the decoder. Thus in a variable length system, the encoder and decoder would only need to agree on which polynomial or curve to use for each value of N and K.

An embodiment utilizing the fixed codebook variable partition architecture described herein may also use an error correcting code. For example, an (n,k) linear block error correcting code may be defined using an n-by-k matrix T. Encoding is accomplished through multiplying a k element vector v by the matrix T to obtain the error correction encoded result T*v. For example, one of the simplest error correcting codes is a (n=3,k=2) single parity check code where 2 information bits a_0 and a_1 are encoded into the vector [a_0, a_1, a_0 XOR a_1] using the exclusive or (XOR) function. In matrix notation, this can be represented as:

$$\begin{matrix}[10]\\[01]\\[11]\end{matrix} * \begin{matrix}[a\_0]\\[a\_1]\end{matrix} = \begin{matrix}[a\_0]\\[a\_1]\\[a\_0 + a\_1]\end{matrix}$$

where all additions are carried out modulo 2 and thus the corresponding T matrix is:

$$T = \begin{matrix}[10]\\[01]\\[11]\end{matrix}$$

Other error correcting codes may be used in an embodiment as will be appreciated by those skilled in the art such as, for example, Reed-Solomon Codes, Convolutional Codes, Trellis Codes, Lattice Codes, and the like. The fixed codebook corresponding to an error correcting code may be represented as all possible values of T*v obtained by running through all possible values of v.

The mapping used when taking a given source vector to the v which minimizes the distortion between the source and the reconstruction may generally depend on the quality vector. For example, the mapping corresponding to a particular vector may involve modifying a standard Viterbi search algorithm by weighting the branch metric computations of the Viterbi systems correspond to fixed codebook variable partition architectures.

To summarize, an embodiment using error correction code based systems can yield a fixed codebook variable partition architecture by using, for example, the following steps:

1. Choose an error correcting code with k information symbols and n coded symbols (e.g., an (n,k) linear block error correcting code).

2. The fixed codebook is then all possible values that can be obtained by encoding encoding all possible k symbol strings into n symbol strings with the error correcting code. If a length k is denoted for an input vector as v, then we can represent the output of the error correction encoding process as T*v. The fixed codebook corresponds to all possible pairs of v and T*v.

3. The previous steps are all done before any encoding or decoding occurs. To encode, an encoder is given a length n source vector and a quality vector. First the encoder determines a mapping which takes the length n source vector into a length k vector v that minimizes the distortion between the source and the reconstruction T*v. This mapping will depend on the quality vector.

4. The vector v is stored or transmitted.

5. The decoder reconstructs the source using the fixed codebook. The encode may apply the error correction encoding algorithm to the stored or transmitted vector v to obtain T*v.

An example using the Reed-Solomon code will now be described in more detail to illustrate the use of an error correcting code in connection with the techniques described herein for lossy compression.

Consider the case where the source, s [i], corresponds to n samples each uniformly and independently drawn from the finite alphabet S with cardinality |S|≧n. Let q [i] correspond to n binary variables indicating which source samples are relevant. Specifically, let the distortion be of the form d(s, ŝ; q)=0 if and only if either q=0 or s=ŝ, where ŝ is the quantized reconstruction of the original source data, s, and q is the quality data. Finally, let the sequence q [i] be statistically independent of the source with q [i] drawn uniformly from the n choose k subsets with exactly k ones. Note that the source, s, quality data, q, and reconstructed source, ŝ, may be represented as vectors of a length n in which a single element in any of the foregoing is denoted with a subscript of "i" (e.g., q[i]), denoting an ith element therein. If the quality data is unavailable or ignored, then losslessly communicating the source would require exactly n·log |S| bits. An embodiment of the encoder may also communicate to the decoder which samples are relevant and then send only those samples.

In one example, let the source samples s [0], s [1], . . . s [n−1] be a codeword of an (n; k) Reed-Solomon (RS) code (or more generally any MDS (maximal distance separable code) with q [i]=0 indicating an erasure at sample i. The RS decoding algorithm may be used to "correct" the erasures and determine the k corresponding information symbols which are sent to the receiver. To reconstruct the signal, the receiver encodes the k information symbols using the encoder for the (n, k) RS code to produce the reconstruction of ŝ [0], ŝ [1], . . . ŝ [n−1] Only symbols with q [i]=0 could have changed and ŝ [i]=s [i] whenever q [i]=1 and the relevant samples are losslessly communicated using only k·log |S| bits.

Figure 9:
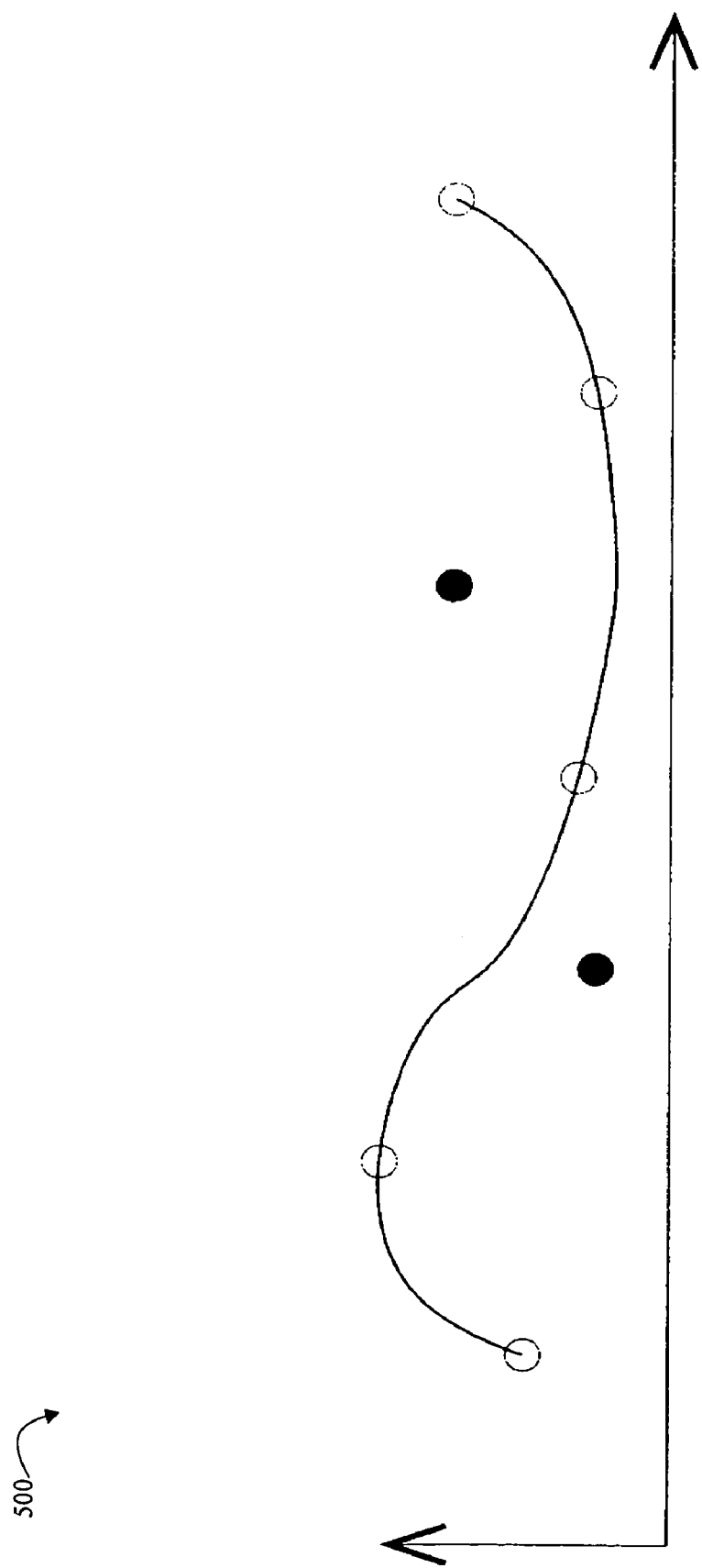
FIG. 9 is a graphical illustration of one of the techniques described herein.

As illustrated in FIG. 9, RS coding can also be characterized as, for example, as curve fitting, and RS encoding can be characterized, for example, as interpolation. In one aspect, the RS source coding approach can be characterized as fitting a curve of degree k−1 to the points of s [i] where q [i]=1. The resulting curve can be specified using just k elements. It perfectly reproduces s [i] where q [i]=1 and interpolates the remaining points. FIG. 9 illustrates an example for losslessly encoding a source with n=7 points (e.g., 7 points in the source data) in which only k=5 points are relevant, as may be indicated by the quality data. The unshaded points indicate those points, which are relevant from the source data. The resulting curve includes k elements, yielding a compression ratio of k/n, and will exactly reproduce those points indicated as relevant.

It should be noted that in connection with curve fitting, a weighting of the source data points may be specified. The weighting may be specified utilizing quality data affecting the accuracy of the curve fit.

Figure 10A:
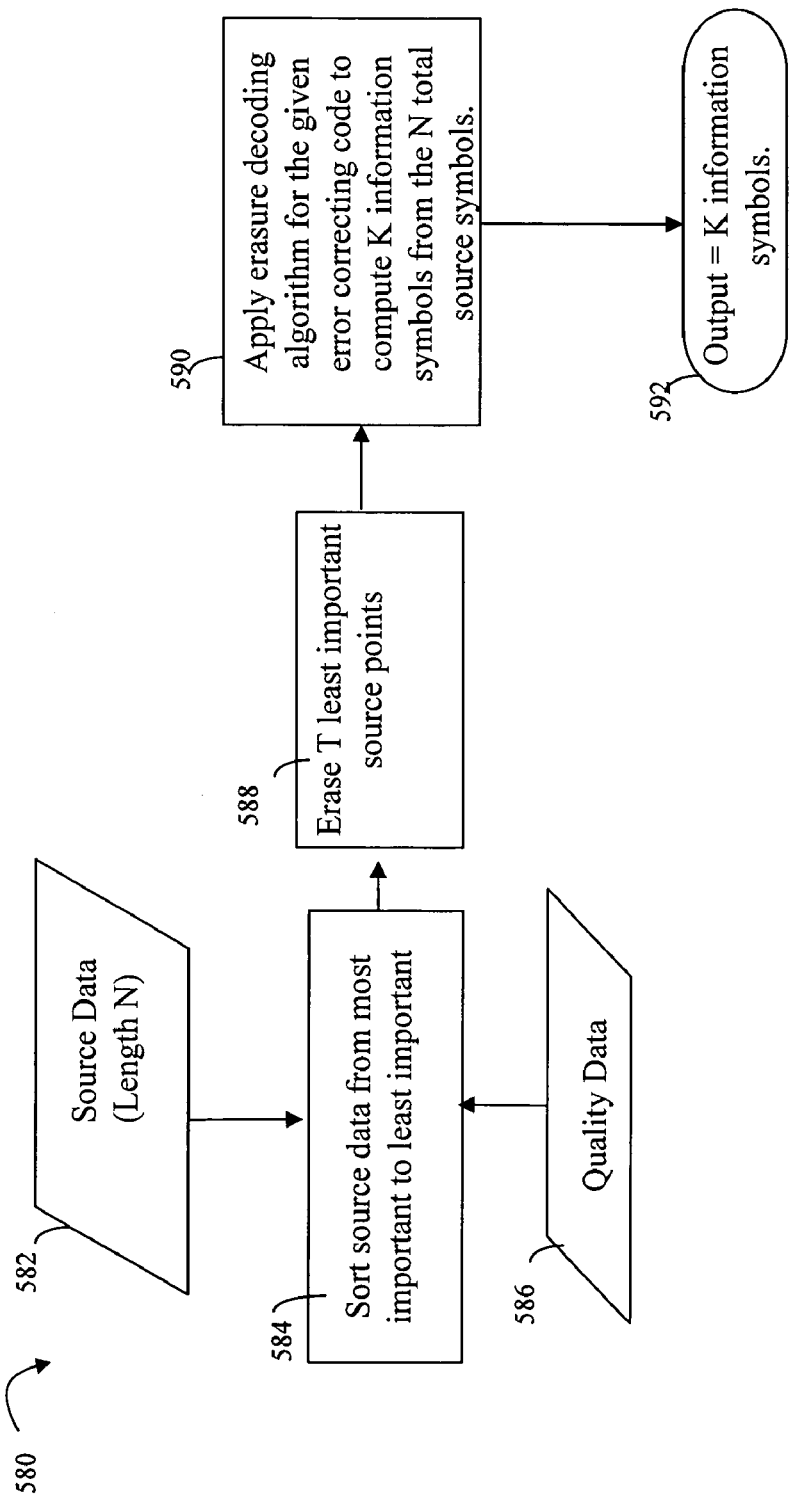
FIG. 10A is a flowchart of processing steps that may be performed in connection with an error correction code embodiment of an encoder using the techniques described herein.

Referring now to FIG. 10A, shown is a flowchart of processing steps as may be performed by an encoder using an error correcting code as described herein. The steps of 580 summarize processing steps just described. A step 584, the source data points 582 are sorted in accordance with the quality data 586. At step 588, the T least important points are erased. It should be noted that the foregoing steps 584 and 588 are similar to other steps described in connection with other embodiments herein. The value of T used in step 588 is as described elsewhere herein in connection with other embodiments. At step 590, an erasure decoding algorithm is applied for the selected error correcting code to compute k information symbols from the total N source symbols. At step 592, the encoder outputs the k information symbols to the decoder.

Another technique that may be used in connection with the fixed codebook variable partitioning as described herein for lossy compression systems is a transform. For example, any linear transform can be represented as a matrix T applied to a vector v to obtain the transformed result T*v. If the transform is fixed and v is restricted to contain integer entries or elements of some discrete set, such as the integers from 0 to 255, then all possible results of multiplying T*v yield a fixed codebook. The mapping takes a given source vector to the v which minimizes the distortion between the source and the reconstruction may depend on the quality vector. Thus, transform based systems correspond to fixed codebook variable partition architectures. Any one of a variety of different transforms may be used such as, for example, a Discrete Fourier Series Transform (DFT), Discrete Cosine Transform (DCT), and the like.

An embodiment may use transform coding in connection with a fixed codebook variable partition architecture by using, for example, the following steps:
1. Choose a transform T that transforms a vector v consisting of k points into a vector T*v consisting of n points.
2. The fixed codebook is then all possible values of T*v obtained from applying the transform to all possible values of v.
3. The previous steps are all done before any encoding or decoding occurs. To encode, an encoder is given a source vector and a quality vector. First the encoder determines a mapping which takes the source vector into a vector v which minimizes the distortion between the source and the reconstruction T*v. This mapping will depend on the quality vector.
4. The vector v is stored or transmitted.
5. The decoder reconstructs the source using the fixed codebook. The encoder may apply the transform T to the stored or transmitted vector v.

Figure 10B:
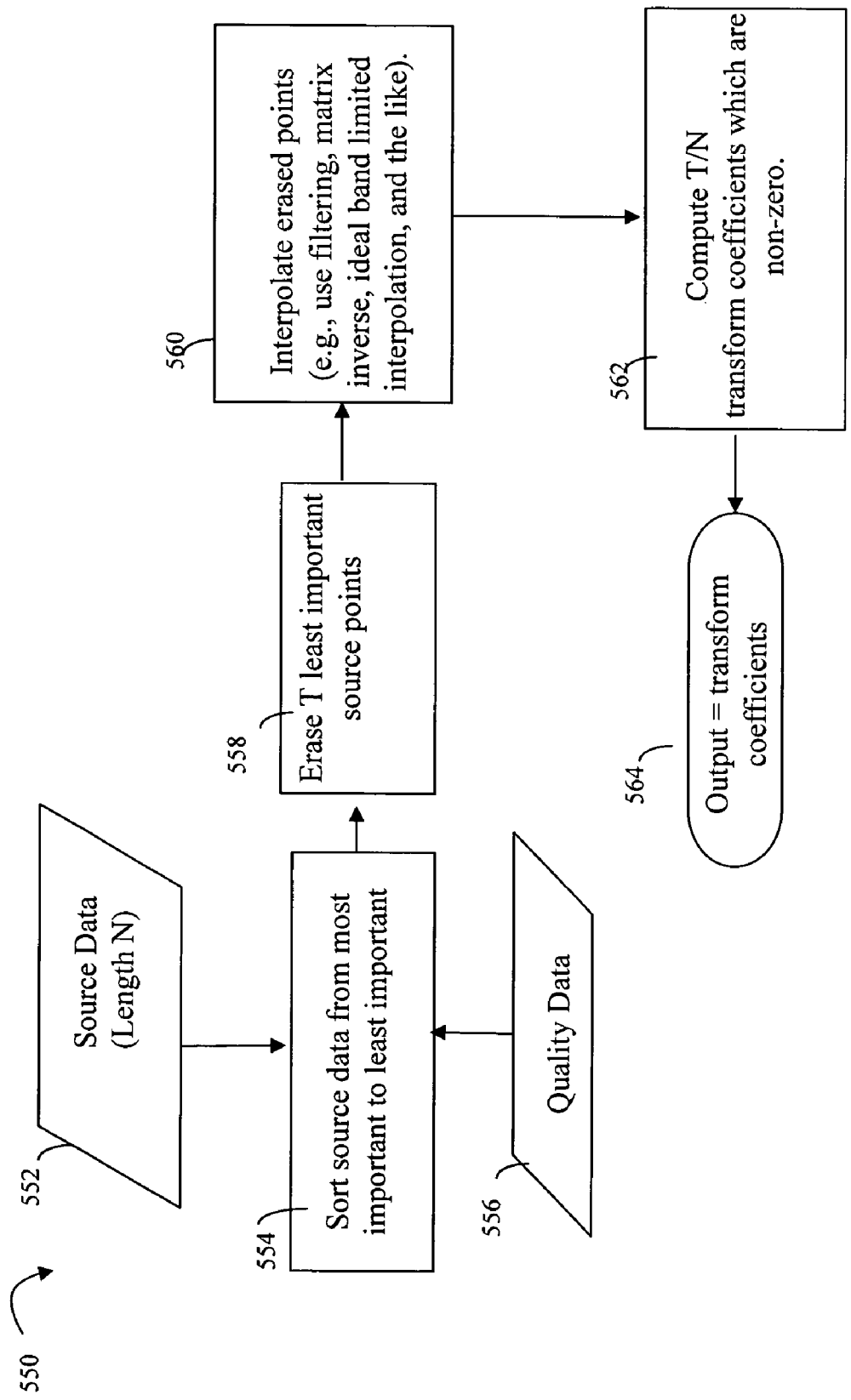
FIG. 10B is a flowchart of processing steps that may be performed in connection with a transform embodiment of an encoder using the techniques described herein.

Referring now to FIG. 10B, shown is a flowchart of processing steps that may be performed in an embodiment in connection with utilizing a transform with the fixed codebook and variable partitioning techniques described herein. The source data, as obtained at step 552, and the quality data, as obtained at step 556, are inputs to the encoder. The quality data may indicate which points are the least or most important and may be used in connection with sorting the source data points in order from most to least important at step 554. Both the encoder and decoder perform processing in accordance with a same transform. The foregoing information may be known by the encoder and decoder such as, for example, when the components are constructed. In other words, the foregoing information may be embodied within the coding logic of the encoder and decoder. An embodiment may also encode the number of points to be evaluated as part of the encoder output which is received by the decoder as an input. At step 558, the encoder erases or ignores the T least important data points. Note that T may be selected by the encoder designer as set forth in connection with other techniques as described herein. At step 560, the erased points, as determined in accordance with the quality data and the value of T, are interpolated. Any one of a variety of different techniques may be used in connection with step 560 interpolation processing such as, for example, by applying a filter, using matrix inversion, ideal band-limited interpolation, and the like. Particular examples are illustrated in more detail in connection with other figures herein. At step 562, the encoder produces the transform coefficients as included in the encoded output in step 564. The decoder performs processing to generate the inverse transform given the transform coefficients.

Figure 11:
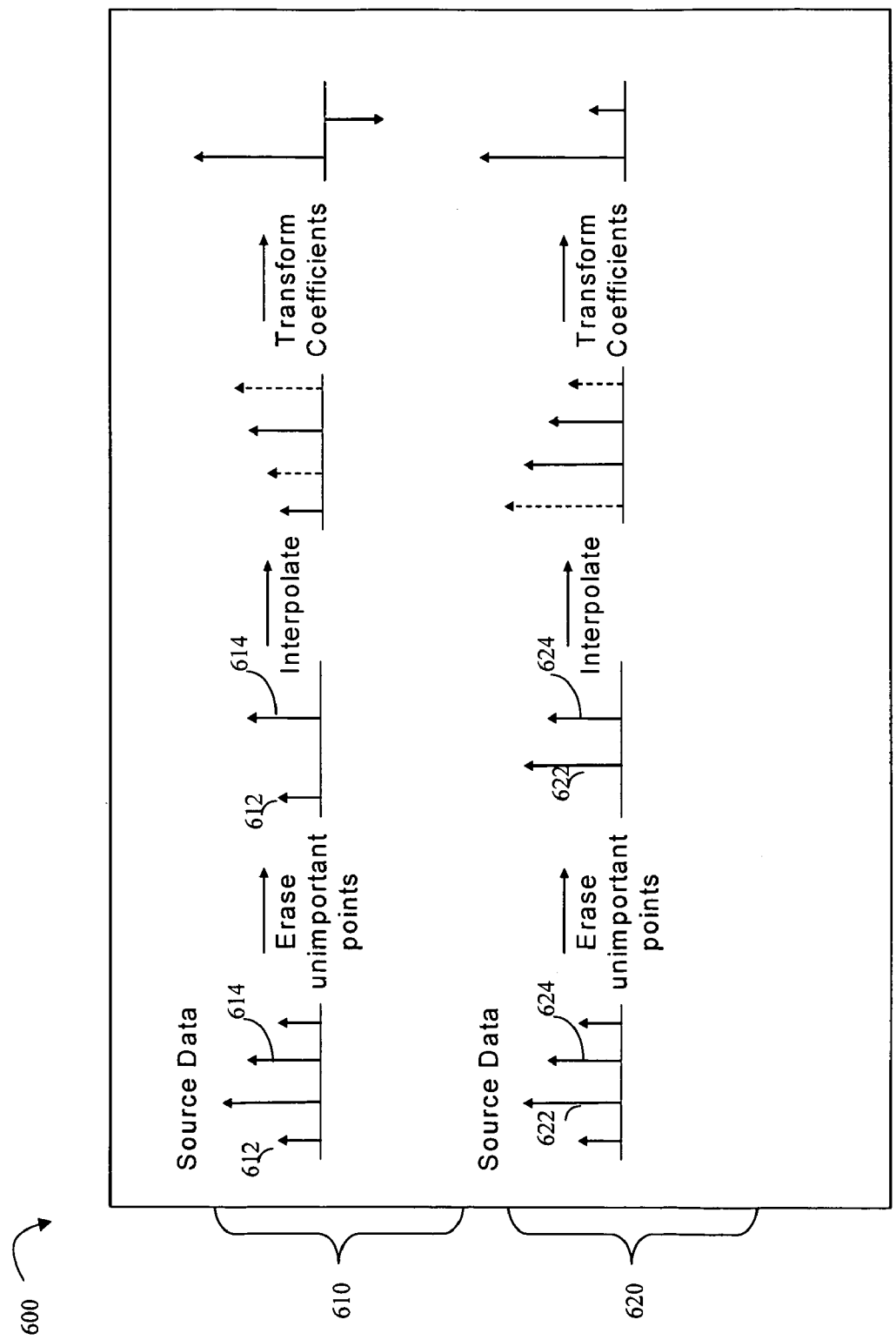
FIGS. 11-12 are examples illustrating the techniques described herein in more detail.

Referring now to FIG. 11, shown are two examples illustrating how the interpolation processing of step 560 of FIG. 10B may be performed in accordance with the specified quality data. In the example 610, the quality information indicates that the second and fourth points are unimportant and thus these points are erased and interpolated to derive the 2 non-zero transform coefficients. Points 612 and 614 are important and are not interpolated. In the bottom example 620, the quality information indicates that the first and fourth points are unimportant and these points are erased and interpolated to derive different values for the non-zero transform coefficients. Points 622 and 624 are important and are not interpolated. The foregoing illustrates an example of a fixed transform codebook. By choosing which points to erase and interpolate in accordance with the quality data, a variable partition may be obtained which can accurately represent the 2 important points. Note that in the foregoing examples, the quality data indicates which two points are least important and a value of T=2 is illustrated in which the 2 least important values are erased.

As will be appreciated by those skilled in the art, there are many ways to perform the interpolation step to find values for the erased points while matching the unerased points and satisfying the constraint that only certain transform coefficients are non-zero. Some methods of performing this interpolation include, for example, filtering and ideal band-limited interpolation, as described in digital signal processing textbooks such as A. V. Oppenheim and R. W. Schafer, with J. R. Buck. Discrete-Time Signal Processing, Second Edition. Prentice-Hall, Inc.: Upper Saddle River, N.J., 1999.

Figure 12:
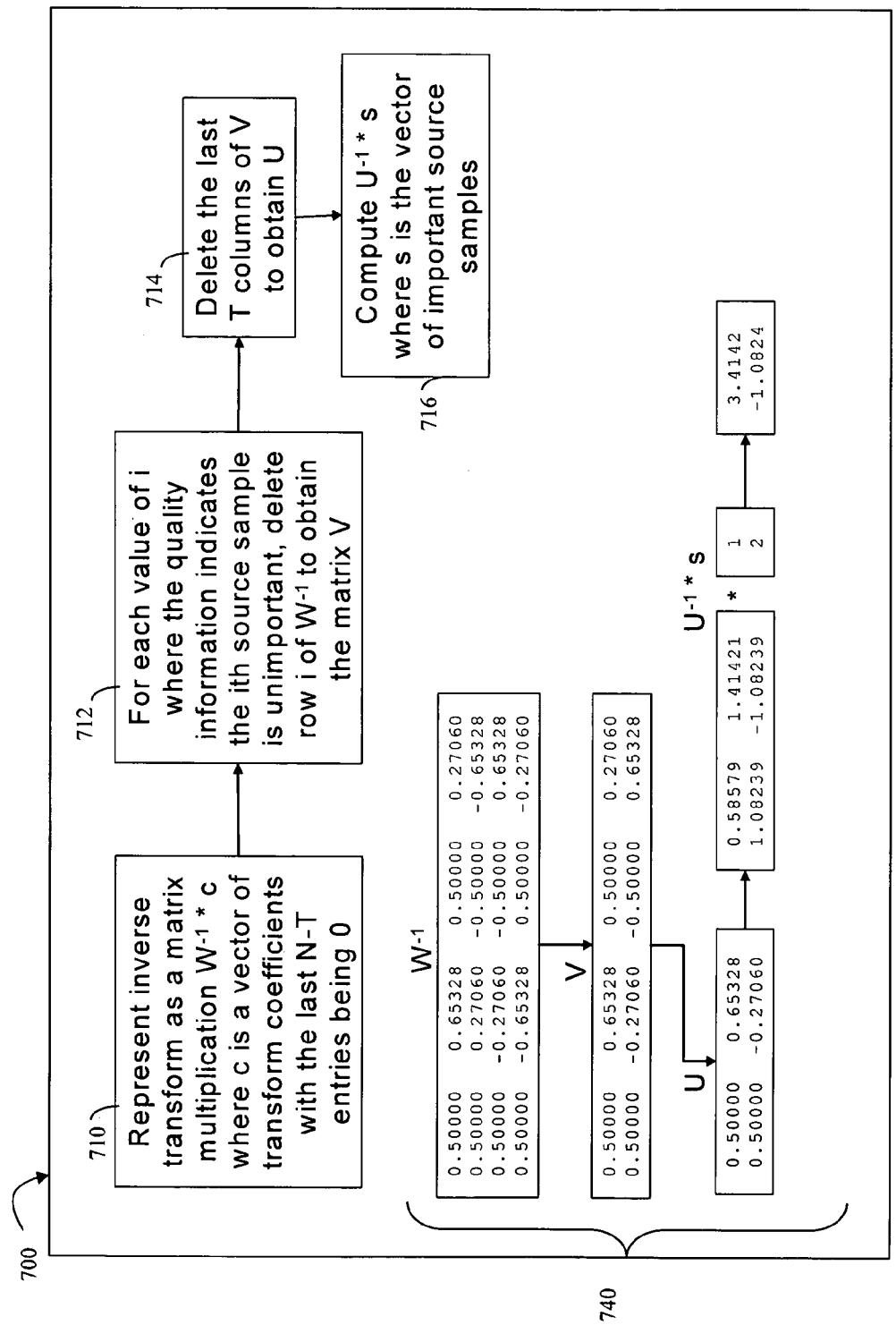

Referring now to FIG. 12, shown is a flowchart of processing steps and an example for performing the interpolation step on any linear transform using a matrix inversion technique. It should be noted that the technique that may be utilized in an embodiment may vary in accordance with the particulars of each embodiment. The matrix inversion technique as illustrated in FIG. 12 may be used in connection with any linear transform. The bottom portion 740 provides a specific numeric example of applying the processing steps of 700.

As known to those skilled in the art, a transform matrix may be formed for the particular points (e.g., x values wherein f(x)=y) being evaluated. Using matrix multiplication, the transform matrix may be multiplied by a vector formed from the transform coefficients (e.g., [$coeff_1$, ..., $coeff_n$]). The particular transform matrix varies in accordance with the particular transform. The result of the multiplication generates a vector yielding the inverse transform. For example, in a case where each data point is represented in two dimensions, x, and y, and f(x)=y, the inverse transform represents a vector of y values as indicated below for the important source samples:

[transform matrix] [$coeff_1$, ..., $coeff_n$]=[$y_1$, ..., $y_n$]

The foregoing is illustrated in more detail below.

At step 710, the inverse transform may be represented using matrix multiplication $W^{-1}*c$ where c is the vector of transform coefficients. The last N-T entries of the vector c are zero. N represents the number of source data points and T represents the threshold as described elsewhere herein. $W^{-1}$ is the inverse transform matrix and may vary in accordance with the particular transform. At step 712, for each value of i where the quality information indicates the ith source sample is unimportant, the ith row of $W^{-1}$ is deleted to obtain the matrix V. At step 714, the last T columns of V are deleted to obtain the matrix U. $U^{-1}*s$ is determined at step 716 where s is the vector of important source samples. The example 740 illustrates the foregoing processing steps using the well-known Discrete Cosine Transform (DCT) of length 4 for a source s=[1 2.5 2 1] and quality information that indicates that only the first and third source samples are important. The resulting DCT transform coefficients are 3.4142 and −1.0824. Applying the length 4 DCT to the vector [3.4142 −1.0824 0 0] correctly reproduces the first and third point.

In connection with the foregoing transform technique, the fixed codebook of quantized points may be characterized as all possible values obtained by applying the inverse transform to all allowed transform coefficient values. The variable partitioning may be characterized as those source data points which are erased and interpolated. The points which are interpolated are those indicated as least important in accordance with the quality information input to the encoder as well as the value of T.

For a fixed length transform coding system, the encoder and decoder agree on a fixed transform, number of source data points (N), and a set S of K non-zero transform coefficients to use. As an output, the encoder produces the K non-zero transform coefficients which are input to the decoder. The decoder reconstructs a lossy version of the source data by taking the K non-zero transform coefficients, adding N-K zeros for the remaining transform coefficients (i.e., the N-K transform coefficients which are not in the set S), and taking the inverse transform of these N points to obtain the N points of the reconstructed source. As with the curve-fitting technique described elsewhere herein in more detail, a variable length system can be obtained by having the encoder also describe the relevant lengths (N and K) to the decoder provided that the encoder and decoder agree on a transform for each value of N and K.

What will now be described is an embodiment of the encoder and decoder utilizing lattice quantizer structures. For any length n sequence $$q\begin{bmatrix} n \\ 1 \end{bmatrix},$$

the number of occurrences of the symbol i is denoted as $$\#\left[q\begin{bmatrix} n \\ 1 \end{bmatrix} \sim i\right]$$

and may also be referred to as the type of $$q\begin{bmatrix} n \\ 1 \end{bmatrix}.$$

Set notation is used with |•| denoting the cardinality of its argument.

Considered is a lossy compression system including an encoder and decoder using the nested lattice techniques described herein. The encoder is presented with a length n source sequence $$s\begin{bmatrix} n \\ 1 \end{bmatrix}$$

and a length n distortion side or quality information sequence $$q\begin{bmatrix} n \\ 1 \end{bmatrix}.$$

The encoder produces an index which is stored or transmitted to a decoder. Using the techniques described herein, the decoder receives the index, but not the quality information sequence.

In connection with the nested lattice encoder and decoder embodiment, it will be appreciated by those skilled in the art that terms referenced herein, such as cosets, lattices, coset representatives, and the like, are well-known although a brief review of some of the terms will now be set forth. The foregoing are described in more detail, for example, in "Coset Codes—Part I: Introduction and Geometrical Classification" by G. D. Forney, Jr., IEEE Transactions on Information Theory, Vol. 34, No. 5, September 1988.

A lattice may be characterized as a set of points obtained by adding all possible integer combinations of some number of basis vectors. A basis vector may be described as a vector defining a shift from one point in a lattice to another point in the lattice. A lattice can be any number of dimensions described by any one or more basis vectors. In one example, the number of basis vectors may be the same as the number of dimensions for a lattice. For example, a 2-D lattice may be defined by the basis vectors (1,0)=x, (0,1)=y defining the shift between lattice points in each dimension. A sublattice may be defined as a subset of points of a lattice. The sublattice is itself a lattice. For example, a sublattice of the 2-D lattice above is one having a 2 unit it of spacing (e.g., basis vectors of (2,0) and (0,2) for the x and y dimensions). The sublattice has a coarser spacing with respect to the lattice. For example, a 2 inch spaced lattice is a subset of a 1 inch spaced lattice.

A coset may be defined as a shift of a lattice. For example, the 1 inch lattice shifted ½ inch horizontally forms a coset of the original 1 inch lattice. A coset is obtained by shifting a lattice as indicated by some vector, v, having d dimensions. The shift can be defined by the vector (1,1), for example, meaning a shift 1 in each of the two dimensions. Each position in the vector v indicates a shift for each dimension. The shift for a dimension can be in any direction as well as "no shift" in a particular direction as may be indicated, for example, by a 0 in the corresponding vector position.

A lattice partition may be defined by taking a fine lattice and separating it into a number of coarse lattices. The latice partition may be defined by shifting a coarser lattice such as, for example, shifting a 1 inch lattice by ½ inch multiple times. As a further example, there may be a lattice with a spacing of 1 inch. There may be defined a first partitioning for this 1 inch lattice into 2 classes representing the even (even integer) and odd (odd integer) spacings. A second partitioning can be defined by further partitioning each of the even and odd classes. A lattice partition chain may be defined as a sequence of lattices such that each lattice in the sequence is a sublattice of a previous lattice in the sequence.

A fine lattice, such as 1 inch spaced lattice, may be represented as a base or more coarse lattice, such as a 4 inch spaced lattice, along with the cosets or shifts of the coarse lattice. The fine lattice may be partitioned into groups called cosets. As an example, the base lattice may include a spacing every 4 units having spacing intervals corresponding to all integers that are multiples of 4 (e.g., 0, 4, 8, 12, . . . ). There are 3 cosets needed to represent all the integers. A first coset may be defined by shifting the base lattice by 1 (e.g., 1, 5, 9, . . . ). A second coset may be obtained by shifting the base lattice by 2 (e.g., 2, 6, 10, . . . ), and a third coset may be obtained by shifting the base lattice by 3 (e.g., 3, 7, 11, . . . ). The base lattice and the foregoing 3 cosets represent the fine 1-inch spaced integer lattice (fine lattice).

A coset representative may be defined as an element from one of the cosets. In order to represent an element or point in the fine lattice, a coset representative from one of the cosets may be added to an element in the base lattice. As another example, the even integers can be shifted by 1 to obtain the odd integers therefore the odd integers are a coset of the even integers. 0 is a coset representative of the even integers and 1 is a coset representative of the odd integers.

More formal definitions and notations will be described for use in connection with illustrating the nested lattice embodiment and examples.

A real, r-dimensional lattice, $\Lambda \subset R^r$ (the set of real numbers) is a regular array of points in space which forms a group under vector addition. The concept of a nesting, as may be related to nested lattices, can be characterized using sub-lattices. Specfically, a sub-lattice $\Lambda' \subset \Lambda$ is any subgroup of $\Lambda$ with respect to vector addition. A sequence of sub-lattices $\Lambda(1) \subset \Lambda(2) \subset \ldots \subset \Lambda(L)$ of the base lattice $\Lambda(L)$ is a nested lattice. Integer nested lattices may be characterized as an example of a nested lattice. Specifically, let $\Lambda(j)$ be integer multiples of $2^{L-j}$. Thus $\Lambda(L)$ is the integers $Z=\{\ldots, -2, -1, 0, 1, 2, \ldots\}$. $\Lambda(L-1)$ consists of even integers $2Z=\{\ldots, -4, -2, 0, 2, 4, \ldots\}$. $\Lambda(L-2)$ consists of multiples of 4, 4Z, and so on.

For a pair of lattices $\Lambda' \subset \Lambda$, the partition of $\Lambda$ is denoted into equivalence classes modulo $\Lambda$ as $\Lambda/\Lambda'$. By taking one element from each equivalence class a system of coset representatives is obtained denoted by $[\Lambda/\Lambda']$. By using a coset decomposition for the partition, a point $\lambda$ may be uniquely specified in the base lattice $\Lambda$ by the sum $\lambda'+c$ where $\lambda'$ is an element of the sub-lattice $\Lambda'$ and c is the coset representative in $[\Lambda/\Lambda']$. For the example where $\Lambda(L)=Z$ and $\Lambda(L-1)=2Z$, it can be specified that $[\Lambda(L)/\Lambda(L-1)]=\{0,1\}$.

This allows representation of any integer $z \epsilon Z$ as $z=e+c$ where e is an even integer and $c \epsilon \{0,1\}$. Based on the foregoing, instead of the representation $$\Lambda(L)=\Lambda(L-1)+[\Lambda(L)/\Lambda(L-1)] \qquad (3.6a)$$

where any element in $\Lambda L)$ is described by an element of $\Lambda(L-1)$ and a coset representative in $[\Lambda(L)/\Lambda(L-1)]$, the further decomposition may be used $$\Lambda(L-1)=\Lambda(L-2)+[\Lambda(L-1)/\Lambda(L-2)] \qquad (3.6b)$$

Combining (3.6a) and (3.6b) yields the representation $$\Lambda(L)=\Lambda(L-2)+[\Lambda(L-1)/\Lambda(L-2)]+[\Lambda(L)/\Lambda(L-1)] \qquad (3.6c)$$

For example, setting $\Lambda(L)=\Delta Z$, with $\Lambda(L-1)=2\Delta Z$ and $\Lambda(L-2)=4\Delta Z$ yields a decomposition. Specifically, to describe an element of a grid of step-size $\Delta$, it may instead be described as an element of a grid of step size $4\Delta$ plus an element from $\{0, \Delta\}$ plus an element from $\{0, 2\Delta\}$. Taken to its conclusion this notation allows us to use the partition chain $$\Lambda(L)/\Lambda(L-1)/\ldots/\Lambda(1) \qquad (3.7)$$

to represent any element of $\Lambda(L)$ with an element of $\Lambda(1)$ combined with the L-1 coset representatives from each partition.

What will now be described is codebook structure and decoding for a nested lattice embodiment. To quantize the source sequence $$s\begin{bmatrix} n \\ 1 \end{bmatrix}$$

with the distortion side information $$q\begin{bmatrix} n \\ 1 \end{bmatrix},$$

the encoder sends three different pieces of information:

1. A list of the number of samples in $$q\begin{bmatrix} n \\ 1 \end{bmatrix}$$

taking the value i (denoted as $$\#\left[q\begin{bmatrix} n \\ 1 \end{bmatrix} \sim j\right]\right).$$

2. A sequence of n elements from the coarsest lattice $\Lambda(1)$ (this sequence is denoted $\lambda_{\Lambda(1)}(i)$ with $i \epsilon \{1, 2, \ldots n\}$).

3. A table of coset representatives, $c[i, j]$, where $c[i, j]$ is the coset representative for the partition $[\Lambda(j+1)/\Lambda(j)]$ for sample i with $i \epsilon \{1, 2, \ldots, n\}$ and $j \epsilon \{1, 2, \ldots, L-1-\}$.

Postponing for the moment how each of these components is determined and encoded, once this encoding of the source $$s\begin{bmatrix} n \\ 1 \end{bmatrix}$$

is received, the decoder reconstructs the sequence $$\hat{s}\begin{bmatrix} n \\ 1 \end{bmatrix}$$

by setting $$\hat{s}[i] = \lambda_{\Lambda(1)}(i) + \sum_{j=1}^{L-1} c[i,j] \quad (3.9)$$

What will now be described is encoding $$\#\left[q\begin{bmatrix} n \\ 1 \end{bmatrix} \sim j\right].$$

The number of occurrences of the sample j in $$q\begin{bmatrix} n \\ 1 \end{bmatrix}$$

can be encoded via entropy encoding (e.g., Huffman coding or arithmetic coding) if a statistical characterization of q is available. Even without any statistical characterization of q, $$\#\left[q\begin{bmatrix} n \\ 1 \end{bmatrix} \sim j\right]$$

can be encoded as a list of L−1 integers from 0 to n where the ith value in the list is $$\#\left[q\begin{bmatrix} n \\ 1 \end{bmatrix} \sim j\right].$$

Note that the value of $$\#\left[q\begin{bmatrix} n \\ 1 \end{bmatrix} \sim L\right]$$

can be determined as n−

$$\sum_{j=1}^{L-1} \#\left[q\begin{bmatrix} n \\ 1 \end{bmatrix} \sim j\right].$$

Thus, describing $$\#\left[q\begin{bmatrix} n \\ 1 \end{bmatrix} \sim i\right]$$

uses at most $$(L-1)\cdot\lceil\log_2 n\rceil \quad (3.10)$$

bits.

What will now be described is encoding $\lambda_{\Lambda(1)}(i)$, the lattice elements. The lattice elements in the base lattice can be encoded by entropy coding (e.g., Huffman coding or Arithmetic coding).

What will now be described is encoding of the table of coset representatives c[i,j] which may be defined in terms of erasure quantizing codes. An (n,k, e) erasure quantizing code over an alphabet X is a set of codewords c∈C with the following properties:
1. Each codeword is a vector of n elements from the alphabet X.
2. The code has dimension k in the sense that each element of C can be uniquely specifed with k letters from c.
3. For any source vector of length n, if at least e positions are marked as erasures, then there exists at least one codeword in C which matches the remaining n−e positions exactly.

For example, the single parity check linear code where C consists of all vectors whose modulo-q sum is zero is an (n, n−1, 1) erasure quantizing code. In general, any maximum distance separable (n, k) erasure correcting code is an (n,k,n−k) error quantizing code and vice versa. (n,k,n−k) erasure quantizing codes may be referred to as maximum distance separable (MDS). For large enough n, it is possible to construct (n, k, e) near-MDS erasure quantizing codes where e/n converges to 1−k/n. Furthermore, constructions of near-MDS erasure quantizing codes exist whose encoding/decoding complexity is linear in the block length.

An embodiment may use erasure quantizing codes to encode c[i, j] as follows. For a given j, instead of describing c[i, j] with i ranging from 1 to n directly, use a near-MDS erasure quantizing code with length n and dimension $$k =, \#\left[q\begin{bmatrix} n \\ 1 \end{bmatrix} \sim j\right]$$

over an alphabet of size[Λ(j+1)/Λ(j)]. The jth erasure quantizing code is used to describe the coset representatives only for those samples where q[i]>j and the coset representatives for samples with q[i] less than or equal to j are marked as erasures. The following example illustrates how erasure quantizing codes may be used to encode the coset representatives.

What has been described is the encoding format itself. What will now be described is an example illustrating the codebook format. How an embodiment of the encoder may map the source data into this format is described in later paragraphs.

Let L=3, with Λ(1) being the integers which are multiples of four, Λ(2) being the even integers, and Λ(3) being the integers (i.e., Λ(1)=4Z, Λ(2)=2Z, and Λ(3)=Z). Furthermore, in the example use a block of length n=3 with $$q\begin{bmatrix}3\\1\end{bmatrix}=(2,3,1,) \text{ and } s\begin{bmatrix}3\\1\end{bmatrix}=(11.8, 1.1, 8.7) \quad (3.11)$$

First, $$\#\left[q\begin{bmatrix}3\\1\end{bmatrix}\sim i\right]=(1,1,1)$$

is described by the decoder. Then, each source sample is quantized to the base lattice, Λ(1), yielding $\lambda_{\Lambda(1)}(i)=(8,0,4)$ and $\lambda_{\Lambda(1)}(i)$ described to the decoder. Note that s[3] in this example is quantized to 4 rather than 8. This is to account for the shifts caused by later choices for coset representatives as described in more detail elsewhere herein.

The first and second samples are more important than the third sample since they have higher values of q [i] (e.g., as indicating by the associated quality information, q). We would like to describe the first and second samples using a finer lattice than the remaining samples. The quantization values for these samples may be refined in the base lattice by specifying the coset representatives for the partition [Λ(2)/Λ(1)] only for the first two samples. This may be accomplished in by using a (3,2,1) binary erasure quantizing code (e.g., a binary single parity check code). We consider the coset representative for the third sample to be an erasure and find a codeword of the (3,2,1) binary erasure quantizing code to match the coset representatives for the first two samples. Thus c[i, 1,1]=(1, 0, 1).

In this example, the second source sample has the highest value of q and we would like to describe this sample with an element from the finest lattice. The quantization value for this sample in Λ(2) can be refined by specifying a coset representative for the partition [Λ(3)/Λ(2)] only for the second sample. This may be accomplished using a (3,1,2) binary erasure quantizing code (e.g., a binary repetition code). Therefore, c[1,2]=(1, 1, 1). The resulting reconstruction is $$\hat{s}\begin{bmatrix}3\\1\end{bmatrix}=(8,0,4)+2\cdot(1,0,1)+(1,1,1)=(11,1,7) \quad (3.12)$$

with an absolute error of (0.8, 0.1, 1.7).

If instead $$q\begin{bmatrix}3\\1\end{bmatrix}$$

is (2,1,3) the base quantization selected in Λ(1) may be $\lambda_{\Lambda(1)}(i)=(8,0,8)$ with c[i,1]=2·(1,1,0) and c[i,2]=(1, 1, 1) to get $$\hat{s}\begin{bmatrix}3\\1\end{bmatrix}=(11,3,9)$$

for an absolute error of (0.8, 1.9, 0.7). In both cases, the use of erasure quantizing codes allow more accurate representation of source data samples with higher values of $$q\begin{bmatrix}3\\1\end{bmatrix}.$$

In previous paragraphs, the decoder and codebook are described. What will now be described is how the source and quality information are mapped into quantized values as may be performed by the encoder. It should be noted that finding the closest point in the lattice is an NP hard problem. Various heuristics may be applied to reduce this complexity. What will be described herein is an encoding procedure of linear complexity in accordance with the block length.

The encoding technique for the nested lattice embodiment may be characterized as a multistage quantization. First, the most important samples are quantized with the q [i]=L where L is the largest possible value for the quality or distortion side information. This process includes quantizing the corresponding s [i] to the finest lattice Λ(L). The resulting points are described in the finest lattice with a coset representation c[i, j]. In one embodiment, in order to efficiently encode c[i, L−1]and avoid spending bits on describing c[i,L−1] for values of i where q [i]<L, erasure quantizing codes may be used. Finally, the resulting coset representatives are subtracted from the source so that later stages work with the remaining quantization error. This completes the encoding for c[i, L−1]. The process is then repeated for samples with q[i]=L−1 and so on. One feature of the foregoing process is that in the vth stage, the process only considers samples with q [i]=L+1−v for decoupling the various lattices. A detailed description of the encoding algorithm follows:

1. Initialize the coset representatives table, c[i, j], to "erasure" for all i∈{1, 2, . . . , n} and j∈{1, 2, . . . , L−1}.
2. Initialize v to v=L.
3. Quantize all source samples with q [i]=v to Λ(v), i.e., compute $\lambda_{\Lambda(v)}(i)$ for all i with q [i]=v.
4. Separate each of the values for $\lambda_{\Lambda(v)}(i)$ found in the previous step 3 into a coset decomposition of the form $$\lambda_{\Lambda(v)}(i)=\lambda_{\Lambda(1)}(i)+\sum_{j=1}^{v-1}c[i,j]\in[\Lambda(j+1)/\Lambda(j)] \quad (3.13)$$

5. Find a codeword in the $$\left(n, \#\left[q\begin{bmatrix}n\\1\end{bmatrix}\sim v\right]\right)$$

near-MDS erasure quantizing code over an alphabet of size |Λ(v)/Λ(v−1)| which exactly matches all unerased values in c[i, v−1] for i ranging from 1 to n.

5A. Decode c[I, v−1] for all i.

6. Subtract the resulting coset representatives from the source, i.e., for each i set s [i] to be s [i]−c[i, v−1].
7. Decrease v by 1.
8. If v>1 return to step 3.
9. Entropy code the description of $\lambda_{A(1)}(i)$ for i ranging from 1 to n (e.g., using Huffman coding, Lempel-Ziv coding, arithmetic coding, etc.).
10. The algorithm is complete and s [i] contains the difference between the original source and the quantized value computed by the algorithm.

To further illustrate the encoding algorithm for the nested lattice embodiment just described, reference is made to the previous example for equation 3.11 with q $$q\begin{bmatrix}3\\1\end{bmatrix} \text{ and } s\begin{bmatrix}3\\1\end{bmatrix}.$$

In the first pass of the encoding algorithm illustrated in connection with FIG. 13, v=3 and s [2] is quantized to 1:1 to the nearest point in the Z lattice to obtain $\lambda_{A(3)}(2)$. The resulting coset representation has c[2, 2]=1 which is encoded by a (3,1,2) erasure quantizing code (i.e., a binary repetition code) to yield $$c\begin{bmatrix}3\\1\end{bmatrix}, 2 = 1.$$

In step 6 of the encoding algorithm, these coset representatives are subtracted from the source to obtain $$s\begin{bmatrix}3\\1\end{bmatrix}' = (10.8, 0.1, 7.7) \tag{3.14}$$

after the first pass or stage completes.

In the second pass, v=2 and s[1]' is quantized to the nearest point in the 2Z lattice to obtain $\lambda_{A(2)}(1)$=10. Note that, in the previous pass it is already determined that $\lambda_{A(3)}(2)$.=1 which in the coset decomposition $$\lambda_{A(3)}(2)=\lambda_{A(2)}(2)+c[2,2] \tag{3.15}$$

implies that $\lambda_{A(2)}(2)$=0. The resulting coset representatives for $\lambda_{A(2)}(1)$ and $\lambda_{A(2)}$ are c[1, 1]=2 and c[2, 1]=0. These coset representatives may be encoded by a (3,2,1) erasure quantizing code (i.e., a binary single parity check code) to yield 2·(1,0,1). Subtracting this from the source yields $$s\begin{bmatrix}3\\1\end{bmatrix}'' = (8.8, 0.1, 5.7) \tag{3.16}$$

at the conclusion of the second stage or pass.

In the third pass, v=1 and s [3]″ is quantized to the nearest lattice point in the 4Z lattice to obtain $\lambda_{A(1)}(3)$=4. Note that in the previous two passes the other source samples have been quantized which, through the appropriate coset decomposition, yields $\lambda_{A(1)}(1)$=8 and $\lambda_{A(1)}(2)$=0. After the encoding process terminates, the reconstruction of equation (3.12) is obtained.

Figure 13:
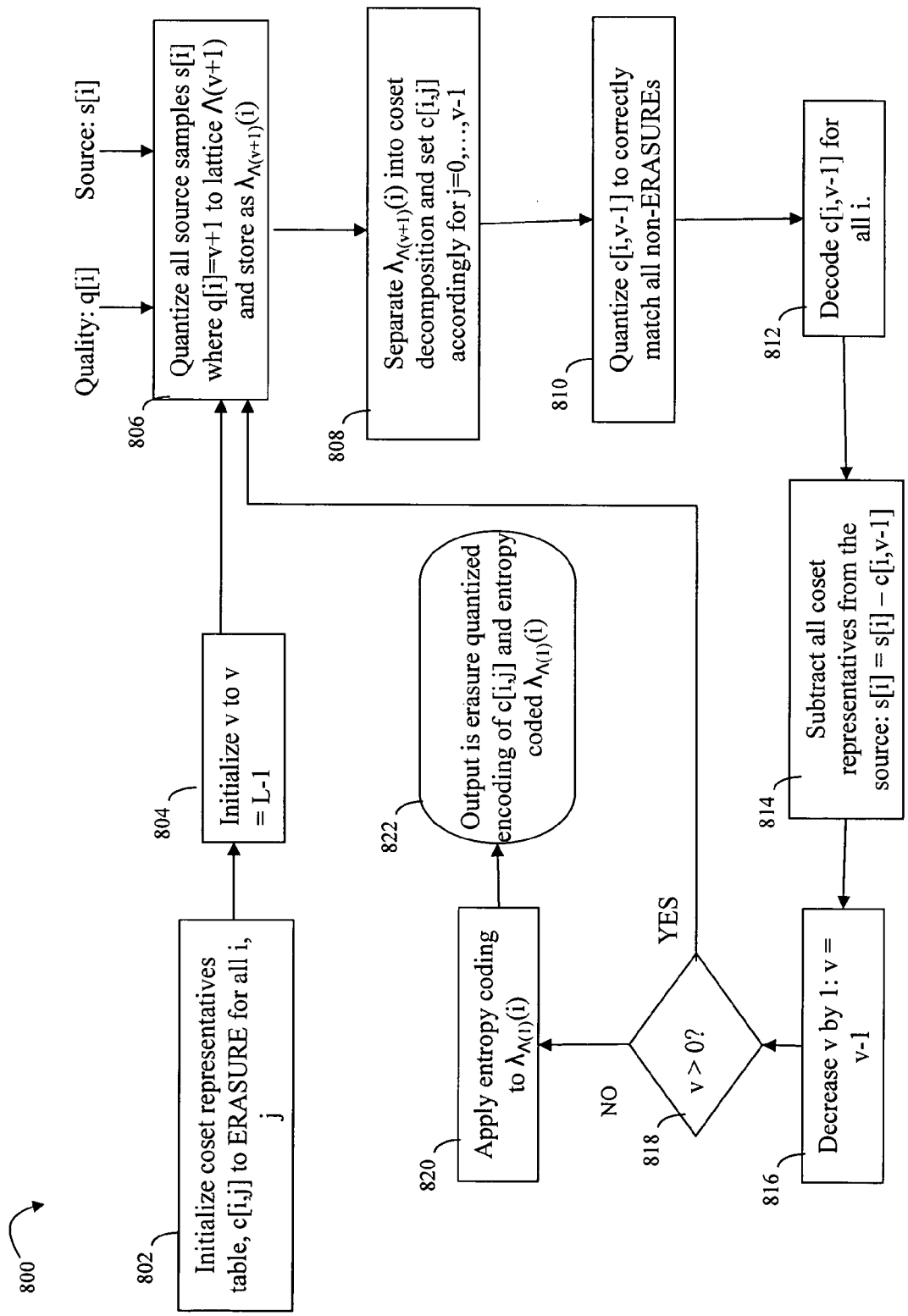
FIG. 13 is a flowchart of processing steps that may be performed in connection with a nested lattice embodiment of an encoder using the techniques described herein.

Referring now to FIG. 13, shown is a flowchart of processing steps that may be performed by a nested lattice encoder. The flowchart 800 described processing steps for encoding described above. The flowchart 800 performs processing in accordance with a ranking or importance of source data points as indicated using the quality data. On a first iteration, the most important points are quantized in terms of finest lattice. On a second iteration, the next set of most important points are quantized in terms of the next finest lattice, and so on. The number of iterations depends on the number of possible levels of quality data which matches a number of levels L in the lattice hierarchy. In other words, there are a number of lattices of varying granularities. A different lattice in the lattice hierarchy may be used in connection quantization of source data points having a particular quality level as indicated by the quality data. The higher the quality or importance of the source data, the finer the lattice that may be used. The technique used in connection with flowchart 800 performs processing for source data points of a specified level of importance and determines the coset decomposition for each source point. Each source point is defined in terms of a coarsest lattice and cosets for an associated degree of the hierarchy or granularity that varies with the specified level of importance (e.g., as indicated by the quality data or information).

At step 802, elements of a coset representatives table are initialized all to null or to indicate erasure points. At step 804, v is initialized to L−1 representing the highest level of importance as indicated by the quality data. At step 806, all source data points of the highest quality level corresponding to v are quantized to a quantization point in the finest lattice associated with quality level v. At step 808, each of the quantization points from step 806 are decomposed as represented in equation 3.13 described elsewhere herein in more detail. As an example, suppose a quantization point selected for one of the source samples in the finest lattice is 1¾ and there are 3 lattices in the partition chain of lattices—1 inch-coarsest lattice, a second lattice having ½ inch intervals and the finest lattice having ¼ inch intervals. The quantization point 1¾ may be iteratively decomposed at step 808 as follows. First, the point 1¾ is a point in the v=3 lattice and is decomposed into cosets and a point in the coarsest lattice as:

1¾ (point in v=3 lattice)=1½+¼ wherein:

1½ is a point in next coarser lattice (v=2), and ¼ is a coset representative of level v =2 lattice. The point 1½ in the v=2 lattice is then further decomposed or defined in terms of the next coarser lattice, v=1, as:

1½=1+½ wherein 1 is a point from the next coarser or base lattice (v=1), and ½ is a coset representative for the level v=1 lattice.

At this point, the decomposition of 1¾ is complete because it has been defined in terms of cosets and a point in the base or coarsest lattice. Step 808 repeatedly performs processing by defining a lattice point at level v in terms of some other lattice point at level v−1 (e.g, using a lattice of one lesser degree) and a coset representative. This process is performed until the original lattice point is defined in terms of the coarsest lattice.

As just illustrated, the quantization point or value 1¾ may be decomposed into 1+½+¼ and represented by the code or vector (1, 1, 1). Similarly, for example, a code of (1, 1, 0) represents the quantization point 1½ for 3 lattices 1, ½ and ¼ units and a code of (2, 1, 0) represents the quantization point for 2½. In the foregoing code or vector, proceeding from left to right, the leftmost position indicates the point in the base or coarsest lattice, the second or middle position indicates a level 1 coset representative, and the right most position indicates a level 2 coset representative. The coset representatives table has indices i,j where i indicates the source sample and j indicates the level of decomposition. The coset representatives table has dimensions i=0 . . . N−1,N=the number of source samples, and j=0 . . . L−2, where L is the number of quality levels=# levels in lattice hierarchy. The ith source point has its decomposition represented by the i−1 th row. Note that in an embodiment using 1 as a base index, the ith source point's decomposition is represented by the ith row.

At step 808, the entries of the coset representative table for the source data points as determined at step 806 of the current quality level v are initialized in accordance with decomposition of source samples. As an example of what is stored in the coset representatives table, reference is made to the quantization values of 1¾ having decomposition of 1+½+¼ represented by (1,1,1) which is stored in the row of the coset representative table for the corresponding source.

As a result of step 808, some elements of the coset representative table are filled in with remaining ones being erasures or null. In other words, step 808 adds values to the coset representatives table for those source samples being processed on the current vth iteration of the loop starting at step 806.

At step 810, one column(e.g., column v−1) of the coset representatives table is quantized using one of the other quantization techniques as described herein, such as, for example, curve fitting, RS encoding, transform encoding, or error correction coding. Step 810 processing examines all coset values for one quality level as included in column v−1 for which a quantization techniques, such as curve fitting described herein, is performed using the significant points which are the non-erasures or non-null points.

At step 812, values are determined for the erased points in the coset representatives table for the current column, v−1. The values may be determined by performing an evaluation of points in accordance with the particular technique used in step 810. At step 810, suppose, for example, a curve fitting technique as described elsewhere herein is used with the current column, v−1, of non-erased values to produce curve coefficients. Step 812 utilizes these curve coefficients and evaluates the curve at a set of points. For example, step 812 determines y=f(x)) for x=0 . . . n where the resulting function values—y values—are stored in the coset representatives table. Note that the foregoing results in interpolating all erased points and populating the coset representatives table with values for these previously erased points. The values for non-erased values remain the same. In this example, the values for which evaluation is being performed (e.g., the "x" values for f(x)) are implied as the index values for i although other embodiments may perform the evaluation for other values.

At step 814, the coset representatives are subtracted from the source data values as stored in s[i]'s. Step 814 adjusts source values which are not of the current quality level being addressed by the current iteration (e.g., having erasures in the coset representatives table) but for which an interpolated value has been introduced into the coset representatives table accordance with step 812 processing. In other words, for the current iteration as represented by v, interpolation may have produced one component included in a decomposition of a particular source value and the particular source value is adjusted in step 814 to subtract out this one component. The remaining components for the decomposition of the particular source value are determined in connection with other iterations of the loop formed beginning at step 806.

At step 816, v is decremented by 1. At step 818, a determination is made as to whether v is greater than 0. If so, control proceeds to step 806 to proceed with processing of the next significant level as indicated by v. Otherwise, if step 818 evaluates to no, control proceeds to step 820 where entropy encoding is applied to the base lattice point for each source sample, i, as represented by $\lambda_{\Lambda(1)}(i)$.

The foregoing processing determines, for each source sample, i, corresponding coset representatives and a point in the coarsest lattice. In step 822, the entropy encoded values of the base lattice points and the curve coefficients are output. Note that there will only be curve coefficients for the non-erased or non-null values in the coset representatives table. Using the curve coefficients, the decoded values (e.g., the y=f(x) values) can be determined for particular points (e.g., x values) agreed upon by the encoder and decoder.

Figure 14:
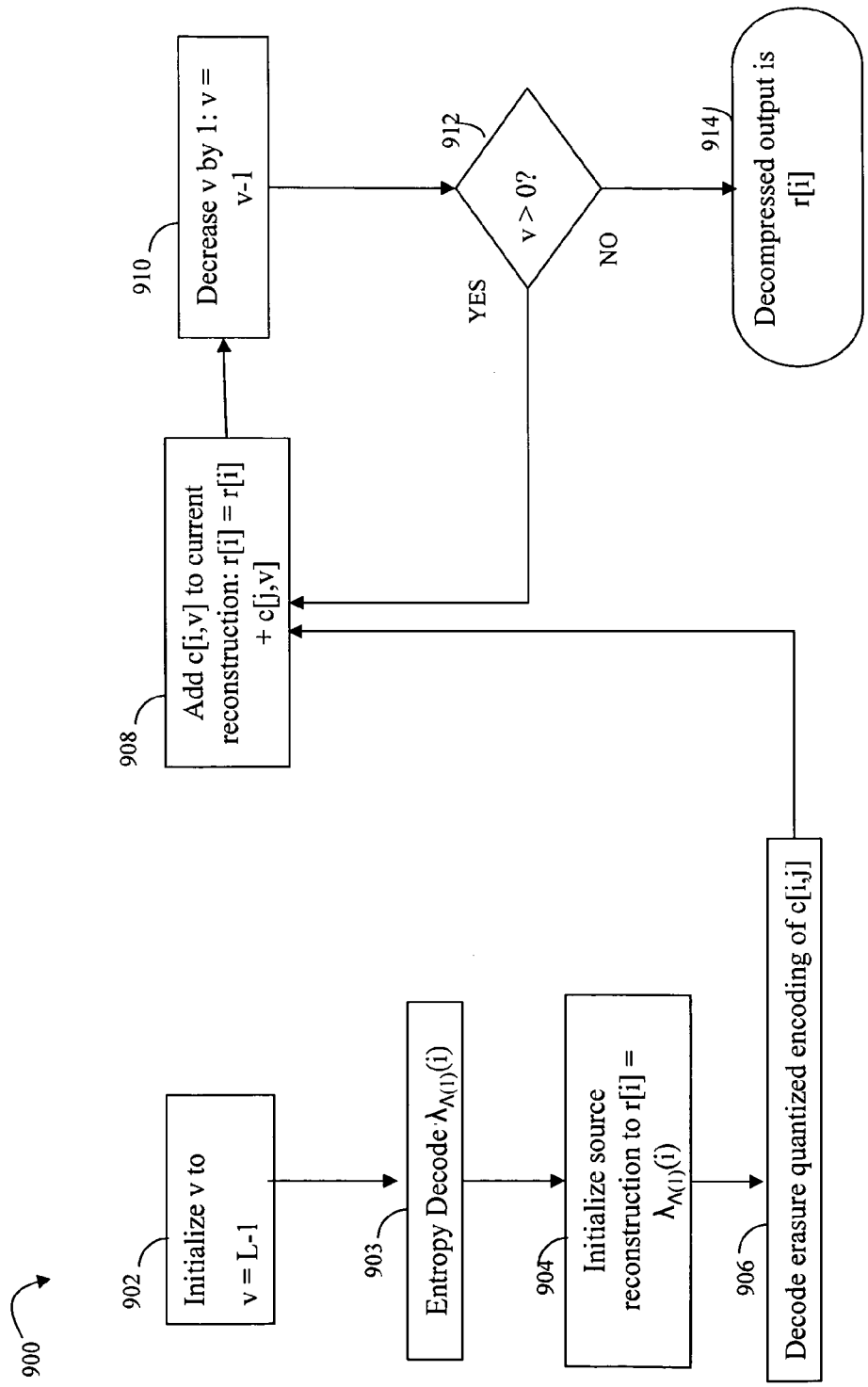
FIG. 14 is a flowchart of processing steps that may be performed in connection with a nested lattice embodiment of an decoder using the techniques described herein.

Referring now to FIG. 14, shown is a flowchart of processing steps that may be performed by a decoder utilizing the nested lattice technique as described herein. The decoder performing the processing steps of 900 may be used in a system with the encoder performing the steps of flowchart 800 as described in FIG. 13. As input, the decoder receives the entropy coded version of the base lattice description of each point, and the erasure quantized coset representative table. The foregoing are both produced as output in step 822. At step 902, the decoder initializes a level indicator, v, to be one less than the number of levels of quality information. At step 903, the decoder applies entropy decoding to the description of the base lattice points. At step 904, the decoder initializes the source reconstruction r[i] to the base lattice point for each i from 0, 1, . . . , N−1 (where N is the number of source samples to reconstruct). At step 906, the decoder decodes the erasure quantized representation of the coset representative table c[i,j]. At step 908, for each value of i in {0, 1, . . . , N−1 }, the decoder increments the source reconstruction r[i] by the coset representative c[i,v] for the quality level indicated by the current value of v and source sample i. At step 910, the decoder decrements the quality level indicator, v. At step 912, a determination is made as to whether the quality level indicator, v, is greater than zero. If so, processing continues with step 908 for the next quality level. Otherwise, control processed to step 914 to output the reconstructed or decompressed source sample, r[i], for all source samples, i=0 . . . N−1.

For a nested lattice system, the fixed codebook corresponds to all possible points that may be obtained by the decoder. Specifically, the fixed codebook is a lattice that can be constructed by taking the base lattice $\Lambda(1)$ and shifting it by all possible outputs of each erasure quantizing code. The variable partition corresponds to the mapping from a source vector to the quantized output in FIG. 13 (i.e., the rule for mapping a source vector to the quantized output in FIG. 13 varies depending on the quality information vector).

For a fixed length nested lattice encoder, the encoder and decoder agree on the following parameters:

1. The number of source points (N).
2. The number of levels of quality information (L).
3. For each j in {0, 1, . . . , L−1}, the encoder and decoder agree on the number of values of the quality information that take the value j (we denote the resulting list of L numbers as #[q~j])

4. A set of L nested lattices forming the lattice partition chain $\Lambda(1)<\Lambda(2) \ldots <\Lambda(L)$, where $\Lambda(j)<\Lambda(j+1)$ means that the lattice $\Lambda(j)$ is a subset of the lattice $\Lambda(j+1)$.

5. For each j in $\{0, 1, \ldots, L-2\}$, the encoder and decoder agree on a fixed length erasure quantizing code that can correctly match #[q~j] significant values out of a total of N values where each value is an integer in $\{0, 1, \ldots, |\Lambda(j+1)/\Lambda(j)|\}$. The expression $|\Lambda(j+1)/\Lambda(j)|$ denotes the order of the lattice partition $\Lambda(j+1)/\Lambda(j)$, which is the number of shifted copies of the coarser lattice $\Lambda(j+1)$ that are used to form the finer lattice $\Lambda(j)$. The desired erasure quantizing code can be constructed using the curve fitting, error correcting, or transform coding methods described earlier or by using a low density erasure quantizing code as described in the paper "*Iterative Quantization Using Codes On Graphs,*" by Emin Martinian and Jonathan Yedidia, 41*st Annual Allerton Conference on Communications, Control, and Computing*, (Monticello, Ill.) 2003.

6. An entropy coding method and the parameters it requires (e.g., Huffman coding and the associated Huffman coding tables, or Arithmetic coding and the associated context model, or Lempel-Ziv coding and the parsing method).

As an output the encoder produces the output of L−1 erasure quantizing codes (the ones for levels 0, 1, . . . , L−2), and an entropy coded description of the N points selected in the coarsest lattice $\Lambda(1)$. The decoder takes these as input, decodes the erasure quantizing codes, decodes the entropy coded description of the N points in lattice $\Lambda(1)$, and uses these values to produce a set of N points in the finest lattice $\Lambda(L)$. This is the resulting lossy source reconstruction.

As with other embodiments described herein, a variable length nested lattice coding system can be obtained by having the encoder further output the list #[q~j] indicating how many values of the quality information are at level j provided that the encoder and decoder also agree on variable length erasure quantizing codes instead of fixed length erasure quantizing codes.

The techniques described herein utilize a fixed code book with a variable partitioning or rule specification. The foregoing illustrates what may be characterized as a tiling scheme for mapping source data points to quantization points or codewords of a fixed code book.

It should be noted that while curve fitting, transforms, and error correcting codes are all well known, the techniques described herein are illustrative embodiments use the foregoing well known methods to build fixed codebook variable partition systems where the mapping from the source to the encoder output varies with the quality information while the mapping from the encoded bit stream to the reconstruction can be performed without requiring the quality information. Such fixed codebook variable partition architectures for lossy compression often achieve the minimum possible loss or distortion for a given encoding bit rate and hence are significantly better than existing lossy compression systems.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for performing lossy encoding comprising: receiving source data and quality information; and mapping the source data including a plurality of components having a first representation into a compressed representation in which each of said plurality of components has an associated level of distortion in the compressed representation determined in accordance with a value of said each component relative to others of said plurality of components as indicated in the quality information, wherein said compressed representation may be decoded without knowledge of said quality information.

2. The method of claim 1, wherein the compressed representation is formed using a fixed codebook with a variable partition.

3. The method of claim 1, wherein the compressed representation is formed using a transform.

4. The method of claim 1, wherein said quality information indicates an importance of each of said plurality of components included in said source data relative to other components included in said source data.

5. A method for performing lossy encoding comprising: receiving source data and quality information; and mapping the source data into a compressed representation having a level of distortion in accordance with the quality information, wherein said compressed representation may be decoded without using said quality information, wherein the quality information includes a distortion weighting value for each source sample included in said source data, said weighting value weighting an error between said each source sample and a lossy reconstruction of said source sample.

6. A method for performing lossy encoding comprising: receiving source data and quality information; and mapping the source data into a compressed representation having a level of distortion in accordance with the quality information, wherein said compressed representation may be decoded without using said quality information, wherein the compressed representation is formed using a lattice.

7. A method for performing lossy encoding comprising: receiving source data and quality information; and mapping the source data into a compressed representation having a level of distortion in accordance with the quality information, wherein said compressed representation may be decoded without using said quality information, wherein the compressed representation is formed using nested lattices.

8. A method for performing lossy encoding comprising: receiving source data and cuality information; and mapping the source data into a compressed representation having a level of distortion in accordance with the quality information, wherein said compressed representation may be decoded without using said quality information, wherein the compressed representation is formed using a curve fitting technique.

9. A method for performing lossy encoding comprising: receiving source data and quality information; and mapping the source data into a compressed representation having a level of distortion in accordance with the quality information, wherein said compressed representation may be decoded without using said quality information, wherein the compressed representation is formed using an error correcting code.

10. A method for performing lossy encoding comprising: receiving source data and quality information; and mapping the source data into a compressed representation having a level of distortion in accordance with the quality information, wherein said compressed representation may be decoded without using said quality information, wherein the compressed representation is formed using a hierarchy of one or more lattices and a linear code.

11. The method of claim 10, wherein a first source sample included in said source data is indicated by said quality information as more important than a second source sample included in said source data, and said first source sample is assigned a first lattice in said hierarchy and said second source sample is assigned a second different lattice in said hierarchy.

12. The method of claim 11, further comprising:
determining a quantization point in a lattice assigned to a source sample included in said source data; and
decomposing said quantization point for said source sample in said source data in accordance with quality information for said source sample.

13. The method of claim 12, wherein said decomposing further comprises:
performing a number of iterations of a decomposition step in accordance with a specified level of quality information for said source sample.

14. The method of claim 11, further comprising:
quantizing all source samples of said source data of a certain quality level as indicated by the quality data in accordance with an assigned lattice of quantization points;
decomposing each source sample of said certain quality level into one or more decomposition components; and
performing a first technique to correctly match a first decomposition component of each source sample of said certain quality level.

15. The method of claim 14, wherein said first technique interpolates a decomposition component for another source sample at a quality level other than said certain quality level.

16. A method for performing lossy encoding comprising:
receiving a set of points and a set of quality information; and
mapping said set of points to quantized points, wherein a first rule is used for mapping a first of said points to a first quantized point in accordance with a fixed codebook and a first indicator in said quality information, said first indicator indicating a value of said first point relative to other points in said set, said first rule resulting in a level of distortion introduced by said mapping in accordance with said value associated with said first point, a second rule is used for mapping a second of said points to a second quantized point in accordance with said codebook and a second indicator in said quality information, said second indicator indicating a value of said second point relative to other points in said set, said second rule resulting in a level of distortion introduced by said mapping in accordance with said value associated with said second point.

17. The method of claim 16, wherein said quality information indicates an importance of each point in said set of points relative to other points included in said set of points.

18. The method of claim 17, wherein a rule is associated with each level of quality indicated in said quality information, said rule being used to determine a partition associated with each quantization point in said fixed codebook, said partition varying in accordance with said each level of quality.

19. The method of claim 18, wherein a first rule defines a quality level indicating that said first point is more important than said second point, said first rule defining partitions having a finer granularity than partitions defined by said second rule.

20. A method for performing lossy encoding comprising:
receiving a fixed codebook of quantization points and a plurality of rules, each rule defining a different partition used in mapping a source point to a quantization point;
receiving source data including a plurality of source points;
receiving quality information indicating a plurality of quality levels, each of said quality levels being associated with a different one of said rules, each of said source points being associated with one of said plurality of quality levels; and
determining a quantization point for each of said source points in accordance with a quality level and associated rule for each source point.

21. A computer readable medium comprising code stored thereon for performing lossy encoding, the computer readable medium comprising code stored thereon for:
receiving source data and quality information; and
mapping the source data including a plurality of components having a first representation into a compressed representation in which each of said plurality of components has an associated level of distortion in the compressed representation determined in accordance with a value of said each component relative to others of said plurality of components as indicated in the quality information, wherein said compressed representation may be decoded without knowledge of said quality information.

22. The computer readable medium of claim 21, wherein the compressed representation is formed using a fixed codebook with a variable partition.

23. The computer readable medium of claim 21, wherein the quality information includes a distortion weighting value for each component included in said source data, said weighting value weighting an error between said each component and a lossy reconstruction of said each component.

24. The computer readable medium of claim 21, wherein the compressed representation is formed using a lattice.

25. The computer readable medium of claim 21, wherein the compressed representation is formed using nested lattices.

26. The computer readable medium of claim 21, wherein the compressed representation is formed using a transform.

27. The computer readable medium of claim 21, wherein the compressed representation is formed using a curve fitting technique.

28. The computer readable medium of claim 21, wherein the compressed representation is formed using an error correcting code.

29. The computer readable medium of claim 21, wherein the compressed representation is formed using a hierarchy of one or more lattices and a linear code.

30. The computer readable medium of claim 29, wherein a first component included in said source data is indicated by said quality information as more important than a second component included in said source data, and said first component is assigned a first lattice in said hierarchy and said second component is assigned a second different lattice in said hierarchy.

31. The computer readable medium of claim 30, further comprising code for:
determining a quantization point in a lattice assigned to a component included in said source data; and
decomposing said quantization point for said component in said source data in accordance with quality information for said component.

32. The computer readable medium of claim 31, wherein said code for decomposing further comprises code for:
performing a number of iterations of a decomposition step in accordance with a specified level of quality information for said component.

33. The computer readable medium of claim 30, further comprising code for:
quantizing all components of said source data of a certain quality level as indicated by the quality data in accordance with an assigned lattice of quantization points;
decomposing each component of said certain quality level into one or more decomposition components; and
performing a first technique to correctly match a first decomposition component of each component of said certain quality level.

34. The computer readable medium of claim 33, wherein said first technique interpolates a decomposition component for another component at a quality level other than said certain quality level.

35. The computer readable medium of claim 21, wherein said quality information indicates an importance of each component included in said source data relative to other components included in said source data.

36. A computer readable medium comprising code stored thereon for performing lossy encoding, the computer readable medium comprising code stored thereon for:
receiving a set of points and a set of quality information; and
mapping said set of points to quantized points, wherein a first rule is used for mapping a first of said points to a first quantized point in accordance with a fixed codebook and a first indicator in said quality information, said first indicator indicating a value of said first point relative to other points in said set, said first rule resulting in a level of distortion introduced by said mapping in accordance with said value associated with said first point, a second rule is used for mapping a second of said points to a second quantized point in accordance with said codebook and a second indicator in said quality information, said second indicator indicating a value of said second point relative to other points in said set, said second rule resulting in a level of distortion introduced by said mapping in accordance with said value associated with said second point.

37. The computer readable medium of claim 36, wherein said quality information indicates an importance of each point in said set of points relative to other points included in said set of points.

38. The computer readable medium of claim 37, wherein a rule is associated with each level of quality indicated in said quality information, said rule being used to determine a partition associated with each quantization point in said fixed codebook, said partition varying in accordance with said each level of quality.

39. The computer readable medium of claim 38, wherein a first rule defines a quality level indicating that said first point is more important than said second point, said first rule defining partitions having a finer granularity than partitions defined by said second rule.

40. A computer readable medium comprising code stored thereon for performing lossy encoding, the computer readable medium comprising code stored thereon for:
receiving a fixed codebook of quantization points and a plurality of rules, each rule defining a different partition used in mapping a source point to a quantization point;
receiving source data including a plurality of source points,
receiving quality information indicating a plurality of quality levels, each of said quality levels being associated with a different one of said rules, each of said source points being associated with one of said plurality of quality levels; and
determining a quantization point for each of said source points in accordance with a quality level and associated rule for each source point.

* * * * *